United States Patent
Eom et al.

(10) Patent No.: US 12,180,610 B2
(45) Date of Patent: Dec. 31, 2024

(54) HYBRID PULSED LASER DEPOSITION OF COMPLEX OXIDE THIN FILMS MADE FROM ELEMENTS HAVING A LARGE VAPOR PRESSURE MISMATCH

(71) Applicant: Wisconsin Alumni Research Foundation, Madison, WI (US)

(72) Inventors: Chang-Beom Eom, Madison, WI (US); Jungwoo Lee, Madison, WI (US); Jieun Kim, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 18/151,550

(22) Filed: Jan. 9, 2023

(65) Prior Publication Data
US 2024/0229292 A1    Jul. 11, 2024

(51) Int. Cl.
| | |
|---|---|
| C30B 23/02 | (2006.01) |
| C30B 29/24 | (2006.01) |
| C30B 29/30 | (2006.01) |
| C30B 29/32 | (2006.01) |
| C30B 29/68 | (2006.01) |

(52) U.S. Cl.
CPC .............. C30B 23/02 (2013.01); C30B 29/24 (2013.01); C30B 29/30 (2013.01); C30B 29/32 (2013.01); C30B 29/68 (2013.01)

(58) Field of Classification Search
CPC .............................. C30B 23/02; C30B 29/24
See application file for complete search history.

(56) References Cited

U.S. PATENT DOCUMENTS

| | | | |
|---|---|---|---|
| 2005/0166850 A1* | 8/2005 | Li | B01J 19/0046 |
| | | | 204/192.1 |
| 2020/0234953 A1 | 7/2020 | Eom et al. | |
| 2022/0122843 A1 | 4/2022 | Vogt et al. | |

FOREIGN PATENT DOCUMENTS

WO   WO-2008109564 A1 *   9/2008   ............. H01L 35/22

OTHER PUBLICATIONS

Nunn [A review of molecular-beam epitaxy of wide bandgap complex oxide semiconductors].*
Christen [Recent advances in pulsed-laser deposition of complex oxides].*
Sun [Effects of growth temperature, oxygen pressure, laser fluence and postannealing on transport properties of superconducting LaAlO3/KTaO3 111 interfaces].*
Zhao [Advanced CMOS Gate Stack Present Research Progress].*
Herranz [High mobility conduction at 110 and 111 LaAlO3/SrTiO3].*
Weijekoon [Characterization of Copper Iodide Thin Films Fabricated via Laser Assisted Molecular Beam Epitaxy] (Year: 1993).*

(Continued)

*Primary Examiner* — Mandy C Louie
(74) *Attorney, Agent, or Firm* — Bell & Manning, LLC

(57) ABSTRACT

Apparatus and methods for growing films of complex layered metal oxides with high stoichiometries and high crystal qualities are provided. The layered complex metal oxides include two or more metals and oxygen and have a layered structure. The methods, which are referred to as hybrid pulsed laser deposition (hybrid PLD), synergistically combine the advantages of molecular beam epitaxy (MBE) and pulsed laser deposition (PLD) to grow complex metal oxide films that include metals with very different vapor pressures.

16 Claims, 13 Drawing Sheets

(56) References Cited

OTHER PUBLICATIONS

Lei, Qingyu [Constructing oxide interface sand heterostructures by atomic layer by layer laser molecular beam epitaxy] (Year: 2017).*
Adkison [Suitability of binary oxides for molecular beam epitaxy source materials] (Year: 2020).*
Yoon [Chapter 5: Fabrication and Characterization of Ferroelectirc Oxide thin film]. (Year: 2002).*
Kim [Superconducting epitaxial thin film of 111 KTaO3 grown by hybrid PLD]. (Year: 2022).*
Narkilahti [The structure of strained perovskite KTaO3 thin films prepared by pulse laser deposition]. (Year: 2012).*
Lei, Qingyu, et al. "Constructing oxide interfaces and heterostructures by atomic layer-by-layer laser molecular beam epitaxy." npj Quantum Materials 2.1 (2017): 10.
Ryu, Y. R., T. S. Lee, and H. W. White. "A technique of hybrid beam deposition for synthesis of ZnO and other metal oxides." Journal of crystal growth 261.4 (2004): 502-507.
Filippone, Stephen A., Yi-Yang Sun, and Rafael Jaramillo. "Determination of adsorption-controlled growth windows of chalcogenide perovskites." MRS Communications 8.1 (2018): 145-151.
Sakai, Joe, et al. "Pulsed Laser Deposition of Epitaxial Non-Doped PbTiO3 Thin Films from PbO—TiO2 Mosaic Targets." Coatings 11.6 (2021): 662, pp. 1-11.
Brinks et al, Anisotropic electrical transport properties of a two-dimensional electron gas at $SrTiO_3$—$LaAlO_3$ interfaces, Applied Physics Letters 98, Jun. 21, 2011, pp. 242904-1 to 242904-3.
Wang et al., Critical thickness and strain relaxation in molecular beam epitaxy-grown $SrTiO_3$ films, Applied Physics Letters, vol. 103, Nov. 2013, pp. 212904-1 to 212904-4.
Liu et al, Stoichiometry of $SrTiO_3$ films grown by pulsed laser deposition, Applied Physics Letters, vol. 100, 2012, pp. 202902-1 to 202902-3.
Premper et al., In situ stress measurements during pulsed laser deposition of BaTiO3 and SrTiO3atomic layers on Pt(0 0 1), Applied Surface Science, vol. 335, 2015, pp. 44-49.
Bibes et al., Ultrathin oxide films and interfaces for electronics and spintronics, Advances in Physics, vol. 60, No. 1, Jan. 2011, pp. 5-84.
Hernandez et al., Localization of Two-dimensional Electron Gas in LaAlO3/SrTiO3 Heterostructures, Physical review, vol. 85, No. 16, Oct. 2011, 19 pages.
Park et al., Creation of a two-dimensional electron gas at an oxide interface on silicon, Nature Communications, Oct. 19, 2010, pp. 1-7.
Bark et al., Tailoring a two-dimensional electron gas at the LaAlO3/SrTiO3 (001) interface by epitaxial strain, PNAS, vol. 108, No. 12, Mar. 22, 2011, pp. 4720-4724.
Kitahara et al., "Fabrication of particle free AIN thin films by reactive PLO combined with an electron beam and a rotating crucible.", Vacuum, 82 (2008), pp. 109-112.
Wang et al., "Growth mechanisms of GaN epitaxial films grown on ex situ low—temperature AI N templates on Si substrates by a combination methods of PLO and MOCVO.", Journal of Alloys and Compounds, 718 (2017), pp. 28-35.
Notice of Allowance and Fees(s) Due for U.S. Appl. No. 16/252,783, mailed Sep. 30, 2020, pp. 1-9.

* cited by examiner

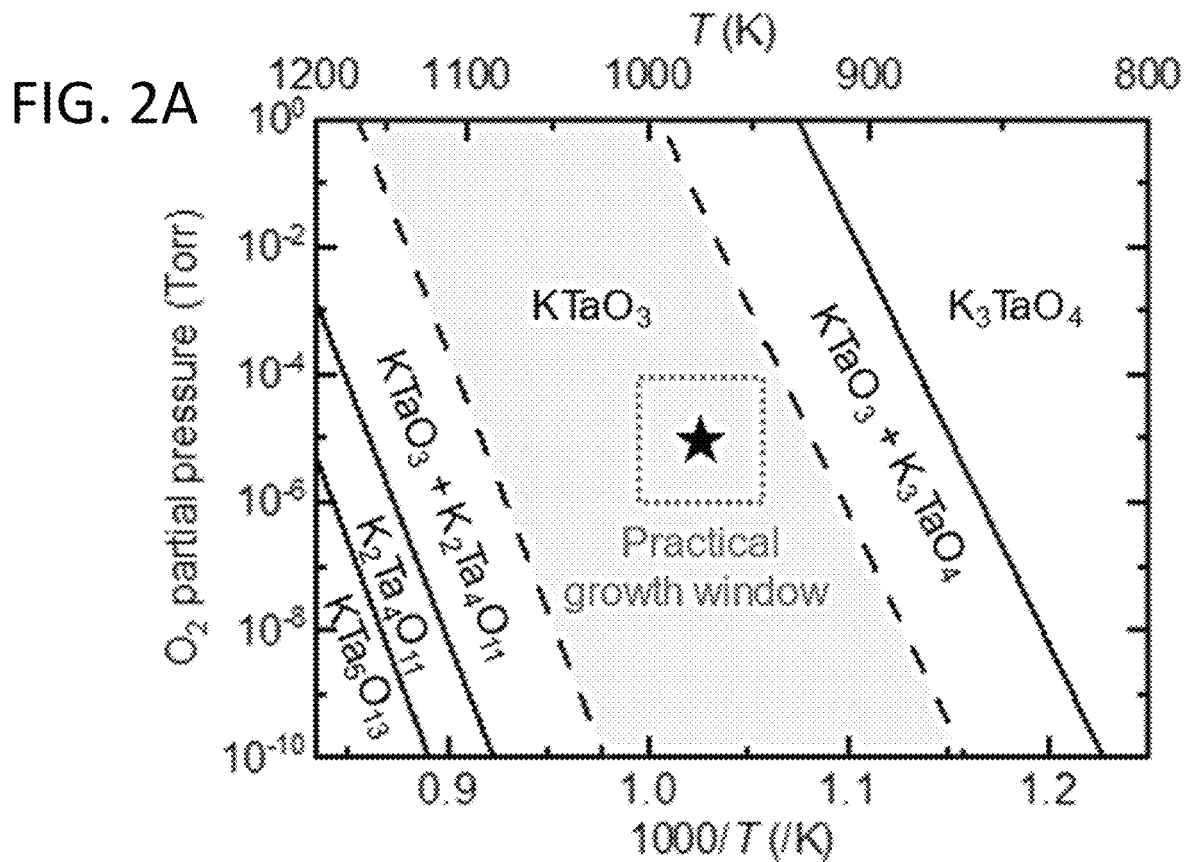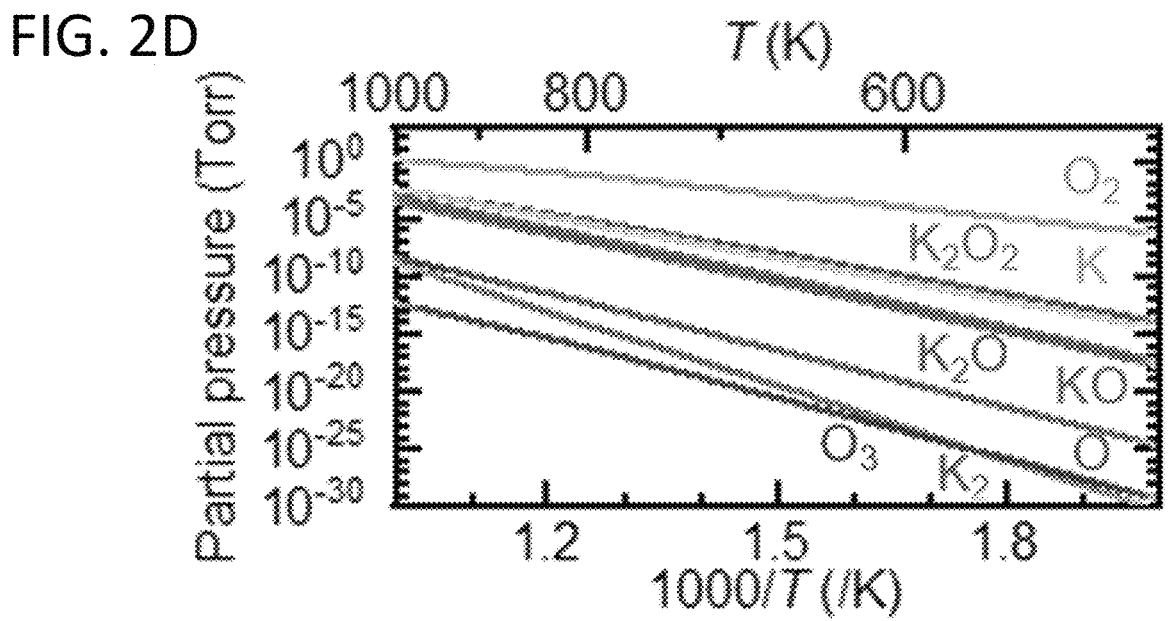

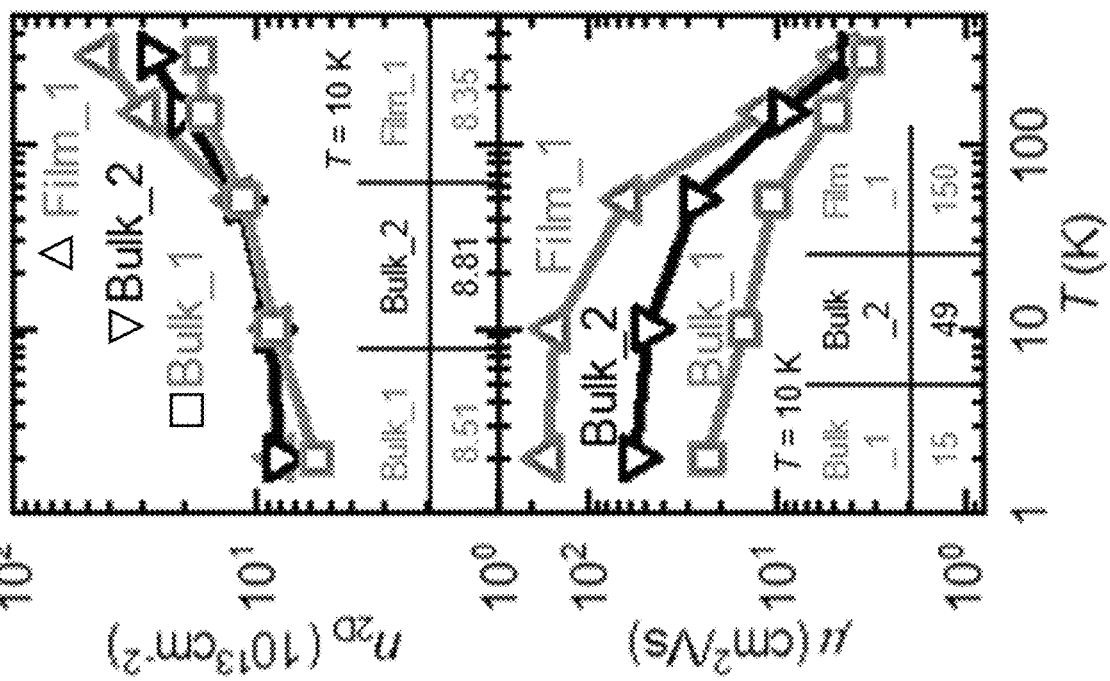
FIG. 4C
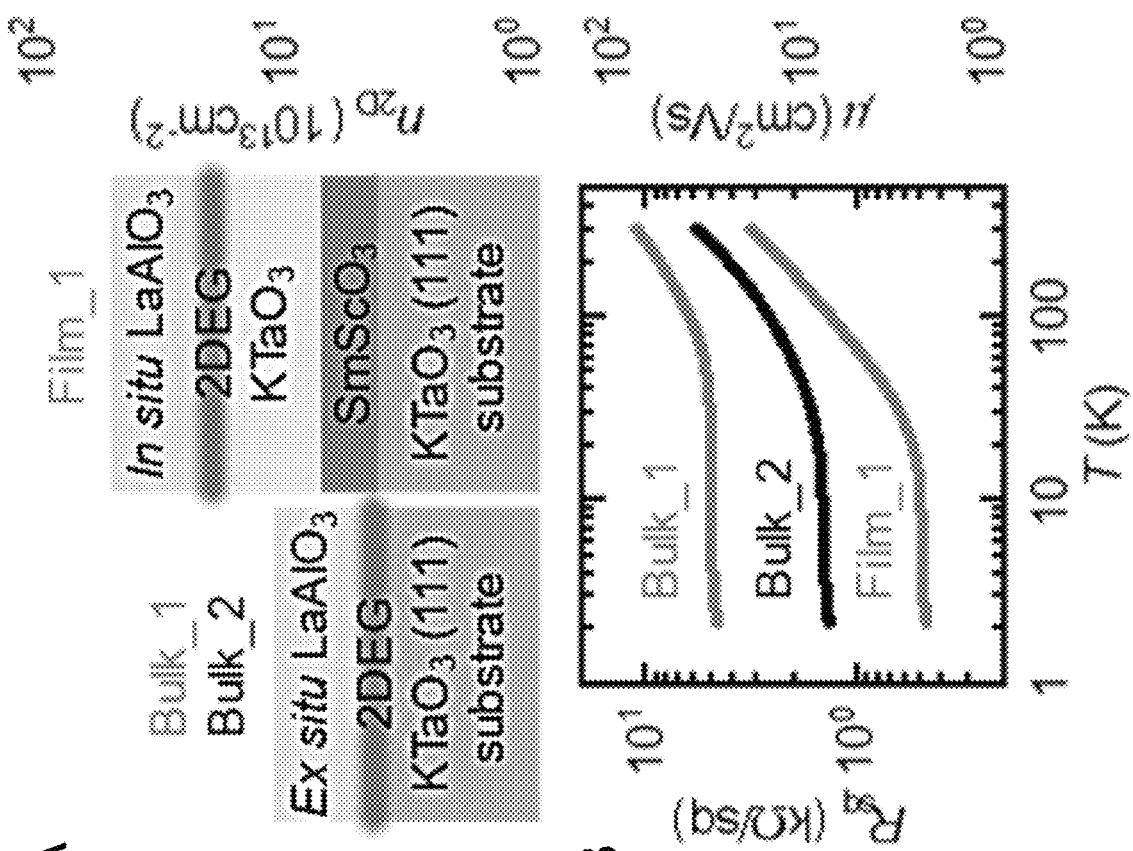
FIG. 4D
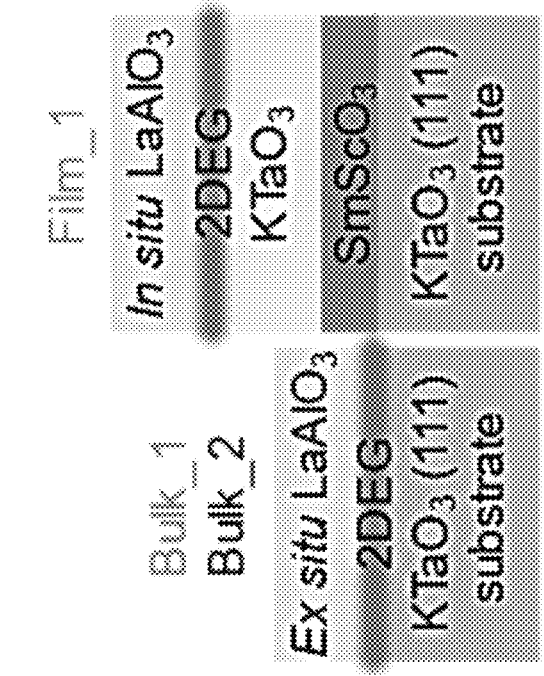
FIG. 4A
FIG. 4B

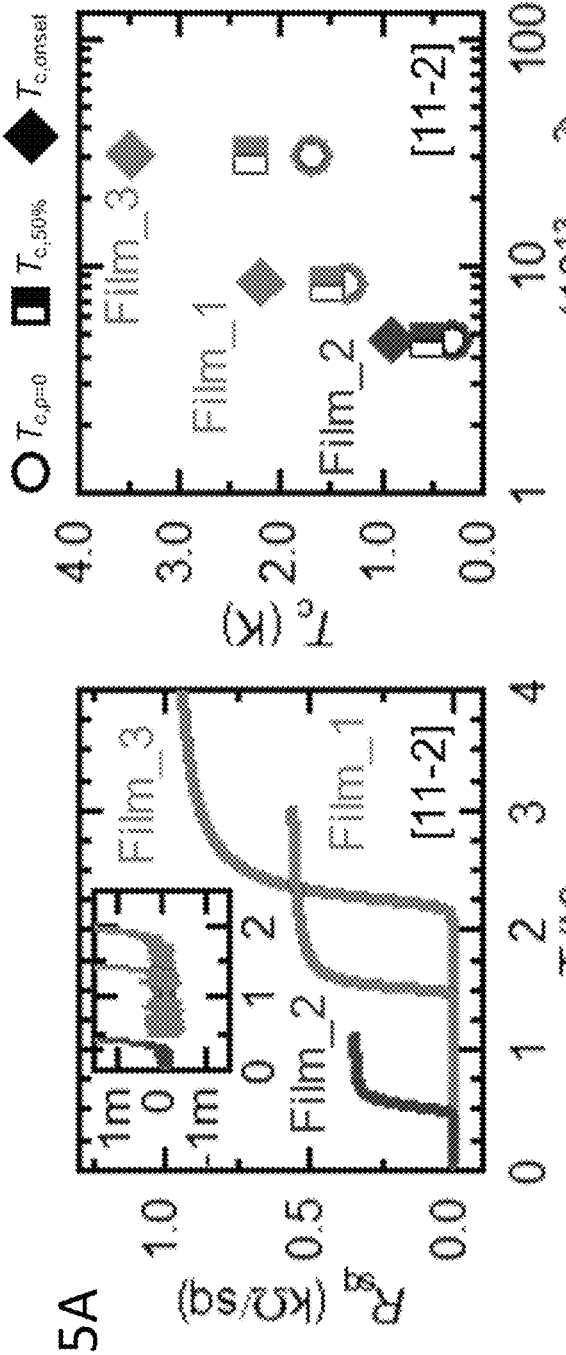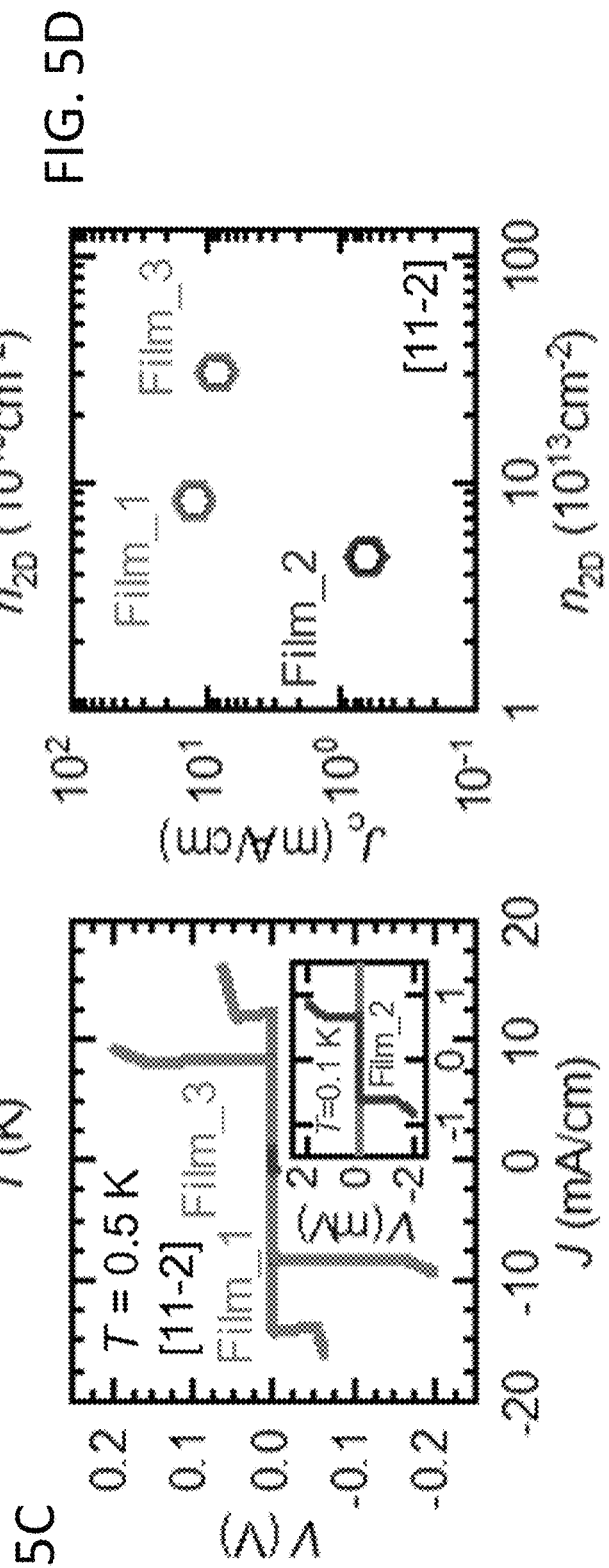

US 12,180,610 B2

HYBRID PULSED LASER DEPOSITION OF COMPLEX OXIDE THIN FILMS MADE FROM ELEMENTS HAVING A LARGE VAPOR PRESSURE MISMATCH

REFERENCE TO GOVERNMENT RIGHTS

This invention was made with government support under DE-FG02-06ER46327 awarded by the US Department of Energy. The government has certain rights in the invention.

BACKGROUND

Modern quantum materials are inherently sensitive to point defects and require a new synthesis route to produce epitaxial oxide thin films and interfaces clean enough to probe fundamental quantum phenomena. Molecular-beam epitaxy (MBE) and pulsed-laser deposition (PLD) are prominent physical vapor deposition techniques in the quest to realize novel quantum materials. Although both are excellent techniques with wide-ranging applications, numerous interesting materials still lie outside their capabilities. An outstanding example is perovskite oxides with a general formula of $A^{1+}B^{5+}O_3$, where the A-site is usually occupied by alkali metals (e.g., lithium, sodium, potassium, and/or rubidium), while the B-site is occupied by refractory metals (e.g., niobium, molybdenum, tantalum, and tungsten). Such compounds present formidable synthesis challenges in thin film forms due to the extreme vapor pressure mismatch of their constituent metal elements (e.g., up to 30 orders of magnitude) and necessitate an alternative synthesis approach.

SUMMARY

Methods for growing films of complex layered oxides with high stoichiometries and high crystal qualities are provided. Also provided are epitaxial heterostructures made using the methods.

One embodiment of a method of forming a film of a layered complex oxide includes the steps of: providing a deposition substrate and a solid metal oxide target comprising oxygen and a first metal in a vacuum chamber; forming a molecular beam directed at the deposition substrate, wherein the molecular beam is formed by evaporation of an oxide of a second metal, the second metal having a higher vapor pressure than the first metal; and laser ablating the solid metal oxide target using a pulsed laser to generate a plume of ablated target material in the presence of the molecular beam, wherein an oxide of the first metal and an oxide of the second metal are deposited onto the deposition substrate via epitaxial growth to form the film of the layered complex oxide.

One embodiment of a heterostructure includes a $KTaO_3$ (111) substrate, a layer of $SmScO_3$ on the substrate, and a layer of $KTaO_3$ (111) on the layer of $SmScO_3$. The heterostructure may further include a layer of a second metal oxide over the layer of $KTaO_3$ (111). The layer of the second metal oxide and the layer of $KTaO_3$ (111) may form a two-dimensional electron gas.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 2A shows the phase region of $KTaO_3$ as a function of $O_2$ partial pressure and temperature at fixed K partial pressure of $10^{-8}$ Torr. Practical experimental parameters within the $KTaO_3$ growth window are marked by a dotted box. The experimental growth conditions for the Example are marked by the star symbol. FIG. 2D shows vapor pressure of gas species in a K—O system.

FIG. 3A shows a HAADF-STEM image of cross-section viewed along the [1-10] and intensity profile. The regions (a) and (b) in the intensity profile indicates the regions appearing brighter in the image near the interfaces of $LaAlO_3$/$KTaO_3$ thin film and $SmScO_3$/$KTaO_3$ substrate. FIG. 3B shows volume color mapping and average volume measurement in FIG. 3A. The average volume is close to the ideal volume in a cubic structure. Approximately ≈2 nm-thick regions of higher volume are observed near the $LaAlO_3$/$KTaO_3$ thin film interface, indicating the oxygen vacancies are confined to the top of the $LaAlO_3$/$KTaO_3$ thin film interface. FIG. 3C shows a magnified image of the $KTaO_3$ thin film/$SmScO_3$/$KTaO_3$ substrate region. FIG. 3D shows a magnified image of the $LaAlO_3$/$KTaO_3$ thin film region.

FIGS. 4A-4K show the effect of μ on electrical transport measurements and superconductivity of (111) $KTaO_3$. FIG. 4A shows a schematic illustrating the structures of measured samples from the Example. In the bulk case, the $LaAlO_3$ overlayer is always grown ex situ, which inevitably creates the 2DEG in the first few nm of $KTaO_3$ with high defect density. In the case of $KTaO_3$ thin film, the $LaAlO_3$ layer is grown in situ and the surface of $KTaO_3$ has low defect density, which results in enhanced μ. FIGS. 4B-4D show temperature dependence (2-300 K) of (FIG. 4B) $R_{sq}$, (FIG. 4C) $n_{2D}$, (FIG. 4D) p of $LaAlO_3$/$KTaO_3$ (111) (Bulk_1, Bulk_2) and $LaAlO_3$/$KTaO_3$/$SmScO_3$/$KTaO_3$ (111) (Film_1) heterostructures. The measurements in FIGS. 4B-4D are performed in a Van der Pauw geometry. The inset tables in FIGS. 4C and 4D are values at T=10 K. FIG. 4E shows distribution of μ and $n_{2D}$ estimated from Hall measurements at T=10 K. The samples shown in FIGS. 4B-4D and FIGS. 4G-4K are marked with arrows. Diamonds are data at T=10 K from different growth conditions of EuO from Liu et al., Science 371, 716-721 (2021). FIG. 4F shows an optical micrograph of Hall bars. FIG. 4G shows temperature dependence (sub 2 K) $R_{sq}$ along the [11-2] on Hall bars. Inset shows zoom-ins near $R_{sq}$=0. h, V-J curves along the [11-2] measured at T=0.5 K on Hall bars. Inset shows zoom-ins near V=0. i, $T_{c,\rho=0}$ and $T_{c,50\%}$ based on Bulk_1, Bulk_2, and Film_1 samples. FIG. 4J shows the same as FIG. 4G but along the [1-10]. FIG. 4K shows the same as FIG. 4H but along the [1-10].

FIGS. 5A-5D show the effect of $n_{2D}$ on superconductivity of clean $LaAlO_3$/$KTaO_3$/$SmScO_3$/$KTaO_3$ (111) heterostructures. Film_1, Film_2, and Film_3 samples from the Example correspond to $n_{2D}$≈8.3, 4.7, and 30.5×10¹³ cm², respectively. FIG. 5A shows temperature dependence (sub 4 K) of $R_{sq}$ measured on Hall bars along the [11-2]. FIG. 5B shows $T_{c,\rho=0}$ (empty circle), $T_{c,50\%}$ (half-filled square), and $T_{c,onset}$ (filled diamonds) vs. $n_{2D}$ diagram based on Film_1, Film_2, and Film_3 samples measured on Hall bars along the [11-2]. V-J curves at T=0.5 K (Film_1, Film_3) and T=0.1 K (Film_2) are shown in FIG. 5C. FIG. 5D shows $J_c$ vs. $n_{2D}$ for Film_1 (0.5 K), Film_2 (0.1 K), and Film_3 (0.5 K) measured on Hall bars along the [11-2].

FIGS. 6A-6C show surface topography of ≈8 nm-thick $KTaO_3$/$KTaO_3$ (111) homoepitaxial structures grown at a substrate temperature of 923 K (FIG. 6A), 973 K (FIG. 6B), and 1023 K (FIG. 6C). All structures were grown with the same $K_2O$ source temperatures of 750 K. FIG. 6D shows surface topography of as-received $KTaO_3$ (111) substrate. The surface was disordered and did not show visible step-terrace structures. FIG. 6E shows surface topography of ≈1 nm-thick $SmScO_3$/$KTaO_3$ (111) heterostructures grown by conventional pulsed-laser deposition. FIG. 6F shows surface topography of ≈8 nm-thick $KTaO_3$/$SmScO_3$/$KTaO_3$ (111) structures. FIG. 6G shows wide-angle θ-2θ X-ray diffraction line scans of ≈8 nm-thick $KTaO_3$/$KTaO_3$ (111) structures grown at substrate temperatures of 923 K, 973 K, 1023 K and ≈8 nm $KTaO_3$/≈1 nm $SmScO_3$/$KTaO_3$ (111) structures grown at a substrate temperature of 973 K. FIG. 6H shows a zoom-in of FIG. 6G near the $KTaO_3$ 111-diffraction condition.

DETAILED DESCRIPTION

Figure 1A:
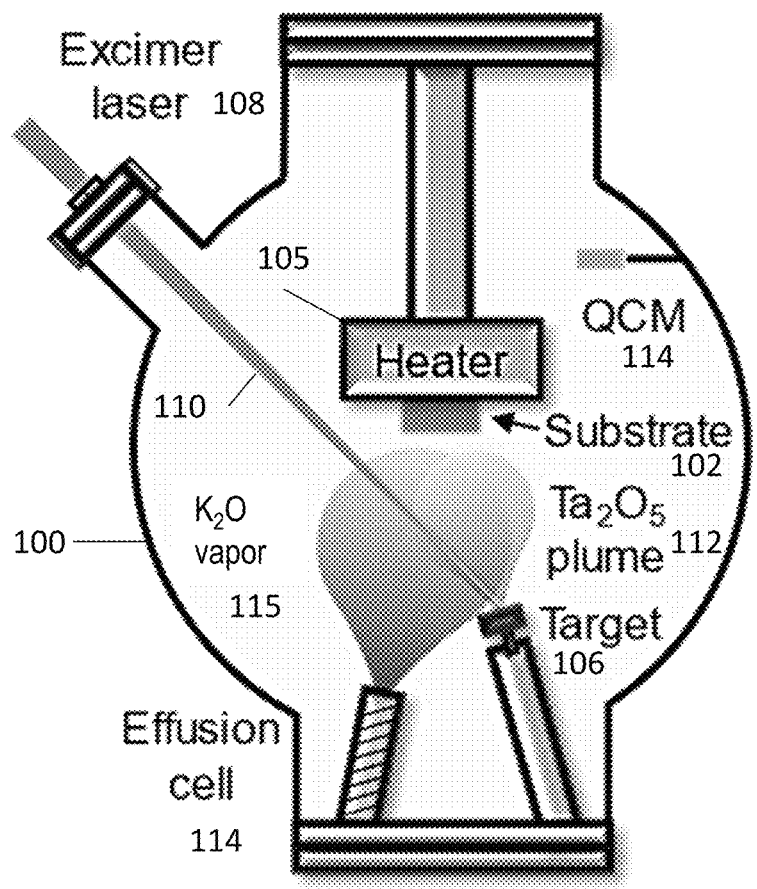
FIG. 1A is a schematic of an apparatus for hybrid PLD thin film growth.

Apparatus and methods for growing films of complex layered oxides with high stoichiometries and high crystal qualities are provided. Also provided are epitaxial heterostructures made using the methods. The layered complex metal oxides include two or more metals and oxygen and have a layered structure in which layers comprising a first metal and oxygen alternate with layers comprising a second metal and oxygen. A variety of layered complex metal oxides can be grown using the methods, including complex metal oxides that are insulators, ferromagnets, antiferromagnets, piezoelectrics, and superconductors.

The method, which is referred to herein as hybrid pulsed laser deposition (hybrid PLD), synergistically combines the advantages of MBE and PLD. In hybrid PLD, films of the layered complex metal oxides are grown layer-by-layer, with layers comprising one or more lower vapor pressure metals and oxygen being deposited by PLD and layers comprising one or more higher vapor pressure metals being deposited by MBE. The use of PLD for the depositions of lower vapor pressure metals is advantageous because PLD is capable of stoichiometric transfer of a target composition to the substrate and produces sharp interfaces. However, PLD, which uses a solid metal oxide source as a target, is poorly suited for the deposition of complex oxides in which the constituent metals have very different high vapor pressures at temperatures that are practical for thin film growth (e.g., at a temperature in the range from about 500 K to about 1200 K). This is because, in conventional PLD in which all of the metals of the complex oxide are grown via pulsed laser ablation of a multicomponent target, metals with very different vapor pressures are ablated noncongruently, with the higher vapor pressure metal leaving the target before the lower vapor pressure metal.

In contrast to PLD, MBE is able to produce metal oxide films having a low defect density and can be used to deposit metals having a high vapor pressure. However, MBE is not conducive to the growth of complex oxides with good stoichiometry control because nonvolatile metals may have a very narrow, or even non-existent, growth window for MBE growth and, therefore, stoichiometric growth requires precise flux control to avoid the formation of off-stoichiometric films and unwanted secondary phases.

Hybrid PLD overcomes the problems associated with conventional PLD and conventional MBE by combining the two processes into a single thin film growth method that enables the growth of highly stoichiometric complex oxide films composed of metals with very different vapor pressures, including metals having vapor pressures that differ by at least ten, at least twenty, or at least thirty orders of magnitude. As a result, hybrid PLD enables the growth of many layered complex metal oxides, including many alkali-based layered complex metal oxides, that lie beyond the growth capabilities of presently known epitaxial growth techniques.

Hybrid PLD Apparatus.

An example of an apparatus for conducting hybrid PLD is shown in the schematic diagram of FIG. 1A. The apparatus includes a vacuum chamber 100 capable of maintaining ultra-high vacuum (UHV; $10^{-7}$ to $10^{-10}$ Pa) pressures and a deposition substrate 102 upon which the complex metal oxide film is grown. The apparatus also includes a heat source in thermal communication with deposition substrate 102 in order to heat and maintain deposition substrate 102 at a selected complex oxide film growth temperature. For example, the heat source can be a heater 105 in physical or thermal contact with deposition substrate 102. Optionally, a quartz crystal monitor (QCM) 114 or RHEED system configured to monitor the growth of the complex oxide film can be included as part of the apparatus.

The apparatus further includes at least one solid metal oxide PLD target 106 housed within vacuum chamber 100 and a pulsed laser 108, such as an excimer laser, positioned to direct a laser beam 110 onto the surface of PLD target 106 to ablate the target material and generate a target material plume 112 comprising metal oxide species. If more than one type of complex oxide film is to be grown, vacuum chamber 100 can house a plurality of different PLD targets for the deposition of different complex oxides. The different PLD targets can be provided on a rotating and/or translating PLD target stage that moves the different targets in and out of the path of laser beam 110. Such a set-up may be used, for example, if heterostructures comprising different complex oxides or other layers of inorganic materials are to be grown. In heterostructures made using the methods described herein, at least one layer of complex oxide is deposited using hybrid PLD. The other layers can be deposited using other methods, such as conventional PLD or conventional MBE.

Solid metal oxide targets used for hybrid PLD growth include at least one metal of the complex oxide to be grown and oxygen. However, in hybrid PLD, the solid metal oxide target does not include all of the elements of the complex oxide film to be grown because it omits one or more high vapor pressure metals and, therefore, is not a stoichiometric target of the type used in conventional PLD. Thus, for complex oxide films that include one or more alkali metals, the solid metal oxide target may include all of the non-alkali metal elements, but not the alkali metals. Solid metal oxide target 106 will commonly include one or more transition metals. Useful transition metals for complex oxides include vanadium, zirconium, ruthenium, hafnium, iron, cobalt, and titanium, and also include refractory metals, such as niobium, molybdenum, tantalum, rhenium, and tungsten.

A molecular beam source 114, such as an effusion cell equipped with a crucible and a heater, is also included in the apparatus. Molecular beam source 114 evaporates a solid source material and directs its vapor, as a molecular beam 115 of the evaporated material, at deposition substrate 102 for MBE growth. The solid metal oxide source material used to generate molecular beam 115 provides a stable source of a higher vapor pressure metal, such as an alkali metal, and oxygen. The source material for MBE growth is preferably, but not necessarily, a suboxide, where a suboxide is defined as a metal oxide having a lower oxygen to metal mole ratio than the complex oxide being formed. For instance, as illustrated in the Example, $K_2O$ can be used as a suboxide MBE source for K atoms in the growth of $KTaO_3$ via hybrid PLD. The use of suboxides can be advantageous for volatile metals, such as sodium (Na), potassium (K), lithium (Li), and rubidium (Rb), which tend to be unstable under ambient and high temperature vacuum conditions used for physical vapor deposition growth. In a high temperature vapor, the suboxide can decompose into $O_2$ and metal atoms in a mole ratio that promotes adsorption-controlled growth of a high-quality crystalline film.

Deposition substrate 102 can be composed of a bulk crystal having the same complex oxide composition as the complex oxide film. However, deposition substrate 102 can also be a different material, provided that deposition substrate 102 and the complex oxide have a sufficiently similar lattice match to allow for epitaxial growth of the complex oxide film of sufficient quality for its intended application.
Hybrid PLD Growth Process.

Figure 1B:
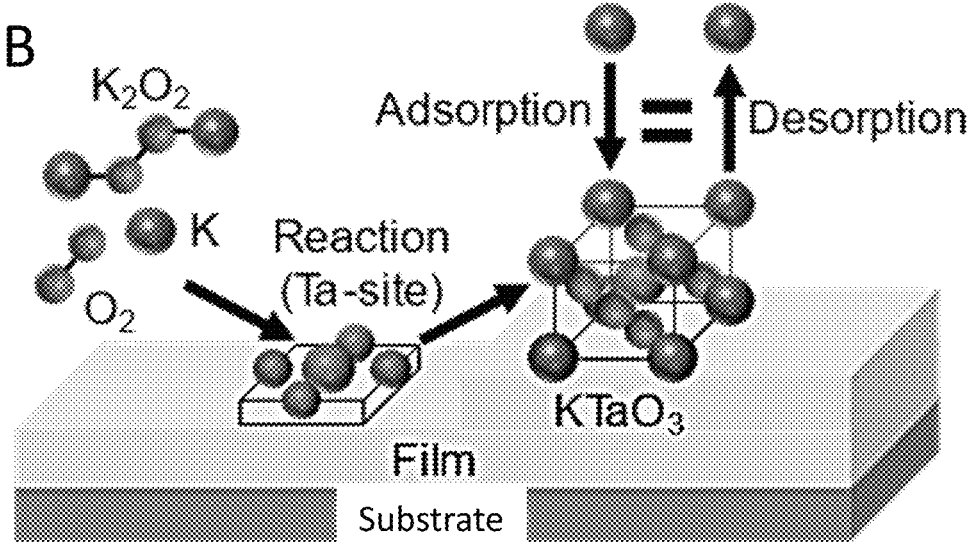
FIG. 1B is a schematic illustrating the adsorption-controlled growth of a $KTaO_3$ thin film.

The hybrid PLD growth process is depicted schematically in FIG. 1B, using $KTaO_3$ as an illustrative complex oxide.

An initial stage in the growth of the complex oxide film is the deposition of a layer of the metal oxide of PLD target 106 onto the deposition substrate to form a first layer of the layered complex oxide that is terminated by oxygen and the metal of the PLD target. For example, during the growth of a $KTaO_3$ film, a ceramic PLD target of tantalum pentoxide ($Ta_2O_5$) can be used to form a Ta- and O-terminated surface layer. The next layer in a layered complex oxide can then be formed via adsorption-controlled deposition of a second, high vapor pressure metal and oxygen on the first layer via MBE growth. By way of illustration, during the growth of the $KTaO_3$ film, K atoms and $O_2$ supplied by thermally evaporating a $K_2O$ source can form a K- and O-terminated layer on the previously deposited Ta- and O-terminated layer. The film growth is carried out at a temperature at which the high vapor pressure metal preferentially adsorbs on the previously deposited PLD layer, but does not effectively absorb once a complete layer of the high vapor pressure of the metal oxide has formed. For example, in the embodiment shown in FIG. 1B, K atoms incident on the growing structure adsorb on the T- and O-terminated layer, but do not significantly adsorb on the K- and O-terminated second layer. This adsorption-controlled growth enables metal cation stoichiometry to be maintained in the growing film throughout the growth process and the proximity to thermodynamic equilibrium afforded by the adsorption-controlled growth minimizes unintentional defects and hence facilitates the synthesis of high-quality complex metal oxide thin films. The layer-by-layer growth stages can continue iteratively until a complex oxide film having the desired thickness is formed.

The thermodynamic growth window that enables adsorption-controlled MBE growth and stoichiometric complex oxide film formation will depend upon the particular source materials being used and the particular complex oxide being grown. However, suitable growth conditions, including substrate temperature, metal oxide source temperature, background pressure, and oxygen partial pressure can be determined based on thermodynamics of the desired complex oxide phases and the vapor pressures of the constituent metal oxide species, keeping in mind that the chamber pressure should allow molecular flow to be maintained in the vacuum chamber (i.e., a chamber pressure well below $10^{-3}$ Torr) and an overpressure of the high vapor pressure metal should be maintained at the surface of deposition substrate 102. In addition, to avoid or minimize bombardment-induced defects from PLD under low chamber pressure conditions, the laser fluence for the PLD is desirably maintained just above the ablation threshold.

Because only the high vapor pressure metal atom or atoms are deposited using MBE, the growth window for a complex oxide using hybrid PLD is wide, easy to control, and within ranges that are readily accessible by vacuum deposition chambers. Due to the hybrid nature of hybrid PLD, the growth parameter space encompasses parameters for conventional MBE and PLD. By way of illustration, in various embodiments of hybrid PLD, source temperatures for the solid metal oxide source can be in the range from about 500 K to 1000 K, deposition substrate temperatures can be in the range from 800 K to 1200 K, including 900 K to 1000 K, and oxygen partial pressures in the range from $10^{-4}$ to $10^{-8}$ Torr, including $10^{-5}$ to $10^{-7}$ Torr, can be used. It should be understood that these ranges are used for illustrative guidance only; additional guidance and detailed methods for calculating suitable deposition conditions are provided in the Example, using $KtaO_3$ as an illustrative complex oxide.
Complex Oxides and Heterostructures Grown Via Hybrid PLD.

While hybrid PLD can be used to form films of essentially any complex oxide, it is particularly suited for growing films that include at least one metal having a high vapor pressure and at least one metal having a low vapor pressure at the film growth conditions. The complex oxides that can be grown include ternary, quaternary, quinary, and even higher order complex oxides, many of which could not have been grown using current techniques.

Perovskite oxides having the formula $A^{1+}B^{5+}O_3$, where A is an alkali metal and B is a transition metal, such as refractory metal, are non-limiting examples of a class of complex oxides that can be grown using hybrid PLD. Perovskite oxides are useful for a range of technologies from environmentally friendly microelectromechanical systems and integrated solid-state batteries to emerging quantum technologies. However, the growth of thin, high crystal-quality thin films of these compounds has proven difficult in the past because the perovskites contain both highly volatile alkali metal and refractory metal elements.

$KTaO_3$ is one specific example of a perovskite oxide that can be grown via hybrid PLD. $KTaO_3$ is a cubic $A^{1+}B^{5+}O_3$ perovskite oxide with a large vapor pressure mismatch between potassium (K) and tantalum (Ta) that hosts many interesting physical properties, such as quantum paraelectricity, large spin-orbit coupling, and two-dimensional superconductivity.

Alkali metal niobates, including, but not limited to, lithium niobate ($LiNbO_3$), potassium niobate ($KNbO_3$), and potassium tantalum niobates (e.g., $KTa_{2/3}Nb_{1/3}O_3$), are other examples of complex oxides that can be advantageously grown as films using hybrid PLD.

Still other examples of complex metal oxides that can be grown using hybrid PLD include superconductors, including alkali metal bisuthates, such as barium potassium bismuthates (e.g., $Ba_{0.4}K_{0.6}BiO_3$), materials useful for thin film solid state batteries, including alkali metal vanadates, such as lithium vanadates (e.g., $Li_xV_2O_5$), where additional compositional tuning may also be achieved by modifying the PLD target compositions.

The complex metal oxide films grown by hybrid PLD can be incorporated into heterostructures comprising one or more additional layers, where the additional layers also may be grown via hybrid PLD or may be grown via other methods, such as other known chemical and vapor deposition processes. Such processes include, but are not limited to, conventional MBE and PLD epitaxial growth.

Examples of heterostructures that incorporate the hybrid PLD-grown complex metal oxide films include heterostructures in which a 2DEG is formed near the interface of the complex metal oxide and a second material, such as a second metal oxide (e.g., a transition metal oxide, an alkaline earth metal oxide, an alkali metal oxide, or a lanthanide metal oxide). The second metal oxide may itself be a second complex metal oxide. By way of illustration, superconducting 2DEGs are known to form in $EuO/KTaO_3$ (111), $LaAlO_3/KTaO_3$ (111), $LaVO_3/KTaO_3$ (111), and $AlO_x/KTaO_3$ (111) heterostructures.

The heterostructures may also include a growth template layer disposed between a bulk substrate, such as a wafer, and a complex oxide film in order to improve the crystal quality and/or surface smoothness of the complex oxide film. A growth template layer may be useful when the bulk substrate comprises a volatile element, such as an alkali metal, that selectively evaporates under vacuum at high temperatures, thereby degrading the quality of the surface of the bulk substrate. By covering the surface of the bulk substrate with a thin growth template layer comprising elements of lower volatility, the quality of the growth surface can be preserved and a higher quality complex metal oxide film can be grown thereon. The growth template material should be selected such that it has a very low lattice mismatch with the complex metal oxide being grown thereon and is also desirably very thin in order to minimize any detrimental effects of the lattice mismatch. Generally, the lattice mismatch between the growth template layer and the complex oxide film growth thereon should be no greater than about 2% and, more desirably, no greater than about 1.5% or no greater than 1%, and the thickness of the growth template layer should be less than about 5 nm and, more desirably, less than about 2 nm, including 1 nm. However, higher lattice mismatches and/or thicknesses may be used, provided that the quality of the complex oxide grown on the growth template layer is sufficient for its intended application. Complex scandate metal oxide thin films are examples of growth template layers that can be used in the epitaxial growth of complex alkali metal oxide films. Tertiary and higher order scandate metal oxide films can be grown on the surface of a bulk substrate composed of the same complex oxide as the complex oxide film to be grown thereon using known epitaxial growth methods. One specific, non-limiting example of a scandate metal oxide is $SmScO_3$, which has a low lattice mismatch with $KTaO_3$ (111).

The thicknesses of the various layers making up the heterostructures will depend on the intended application of the heterostructure. Typically, however, the layers will be very thin with thicknesses of less than 1 μm. This includes heterostructures in which one, more than one, or all of the layers (excluding any bulk substrate) have thicknesses of less than 500 nm, less than 100 nm, and/or less than 10 nm (e.g., thicknesses in the range from 1 nm to 100 nm).

EXAMPLE

This Example demonstrates the hybrid PLD growth of electronic-grade (111)-oriented potassium tantalate ($KTaO_3$) thin films using a combination of thermodynamics-guided thin film synthesis, structural characterizations, and quantum transport measurements.

$LaAlO_3/KTaO_3$ (111) heterostructures with clean interfaces were formed by growing electronic-grade (pseudo-) homoepitaxial $KTaO_3$ thin films on single crystal substrates of $KTaO_3$ (111) using hybrid PLD and in situ $LaAlO_3$ growth by conventional PLD. (Jiang, Y. et al., *Nat. Mater.* 21, 779-785 (2022).)

Figure 2B:
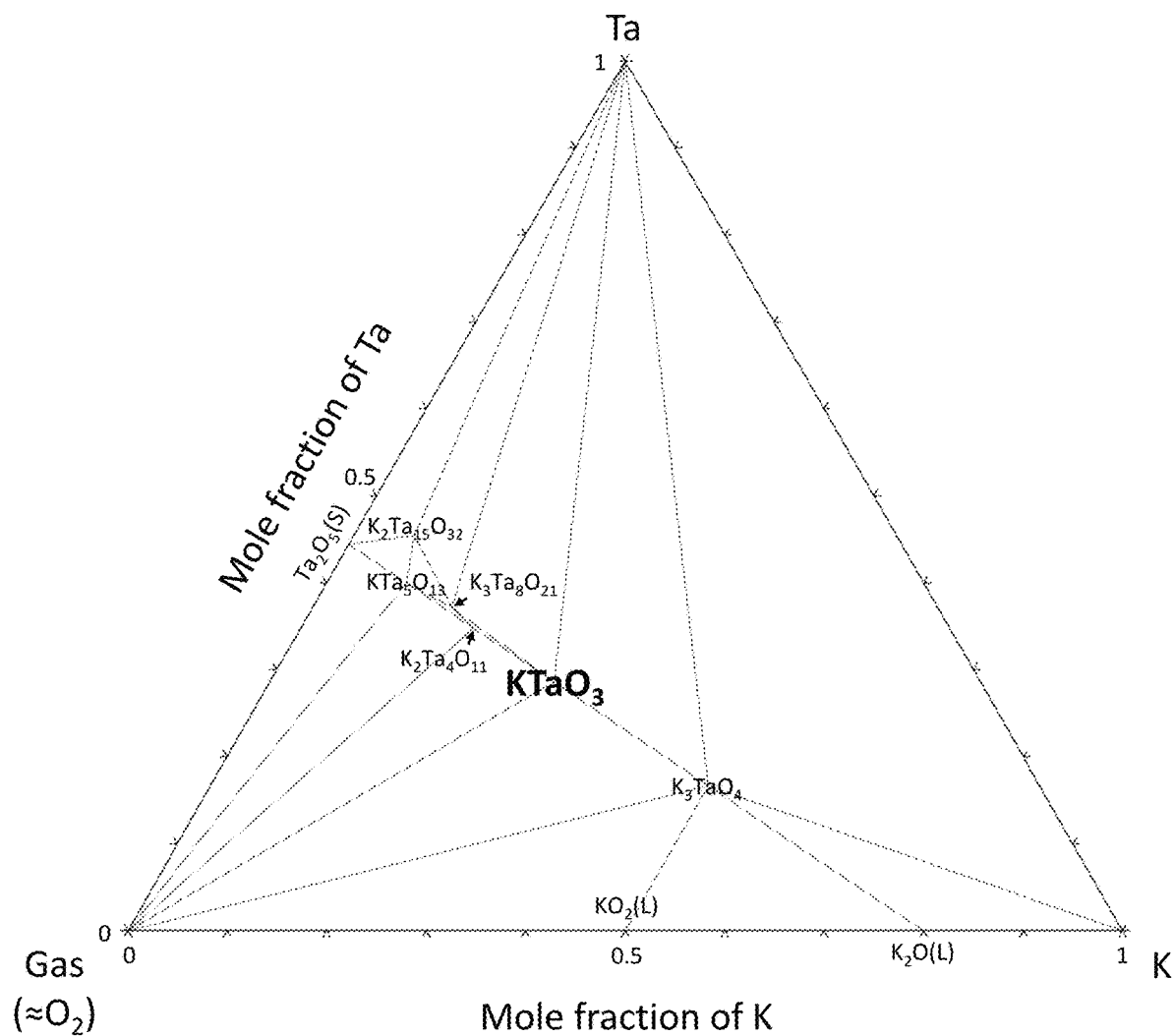
FIG. 2B shows the isothermal section of a K—Ta—O ternary phase diagram at T=1000 K.
Figure 2C:
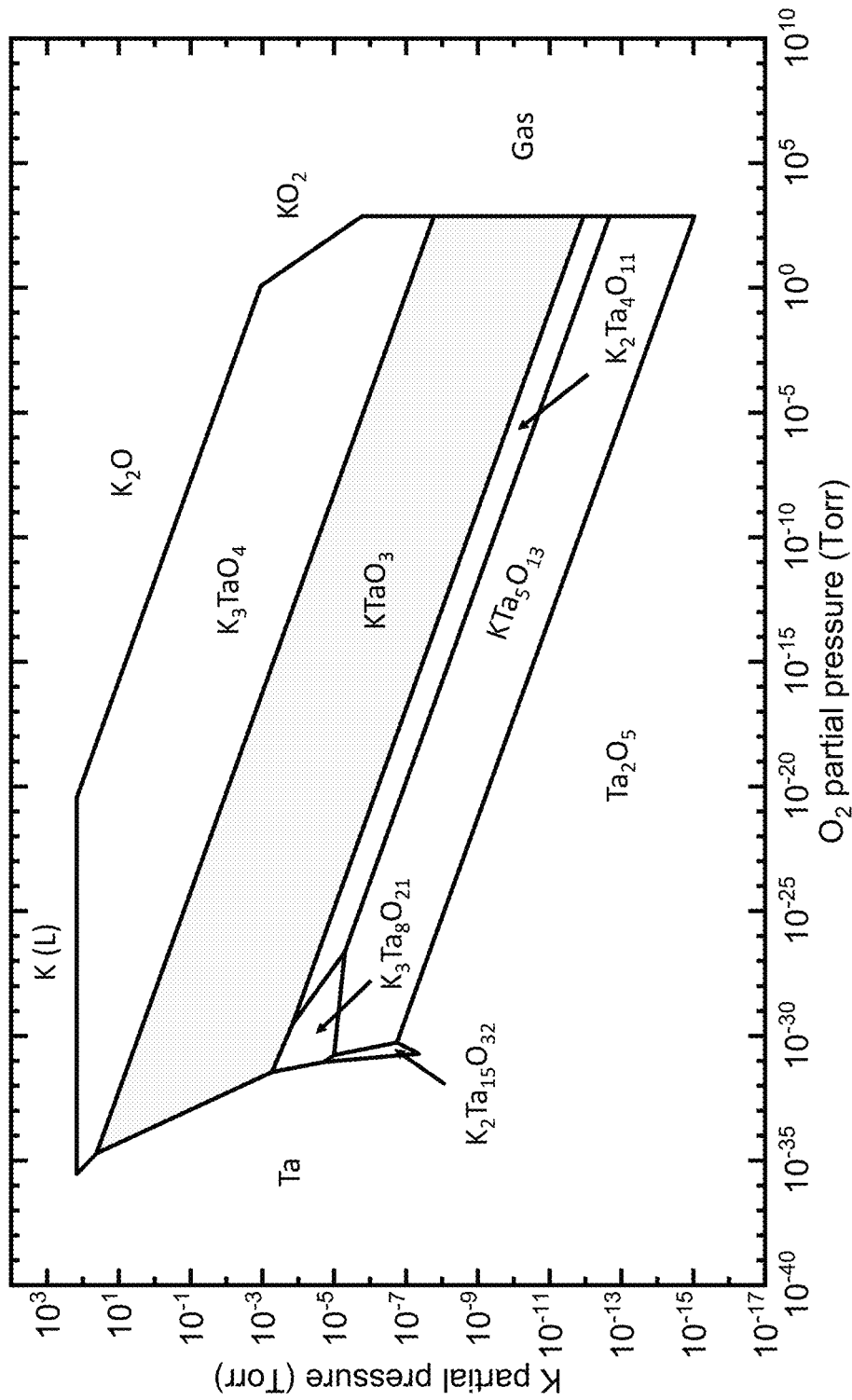
FIG. 2C shows the phase region of $KTaO_3$ as a function of oxygen and potassium partial pressures at T=1000 K.

To identify the hybrid PLD growth parameters of a stoichiometric $KTaO_3$ phase, a thermodynamic database was built for the K—Ta—O system (see Methods, below), and various phase diagrams were predicted. FIG. 2A shows the calculated stability phase diagram of K—Ta—O near the stoichiometric $KTaO_3$ as a function of oxygen ($O_2$) partial pressure and temperature; here, the K partial pressure was fixed at $10^{-8}$ Torr based on the potential phase diagram as a function of K and $O_2$ partial pressures. An isothermal section of the K—Ta—O ternary phase diagram and the phase region of $KTaO_3$ as a function of oxygen and potassium partial pressure at T=1000 K are shown in FIGS. 2B and 2C, respectively.

In experiments, the commercially available potassium oxide ($K_2O$) was used as K source because elemental K is extremely unstable under both the ambient and high temperature/vacuum conditions. To estimate the source temperatures for achieving the stoichiometric $KTaO_3$ synthesis, the vapor pressure of $K_2O$ and partial pressures of all gas species (FIG. 2D) were calculated at source temperatures from 500 to 1000 K. Three major gas species were identified as $O_2$, $K_2O_2$, and K with the calculated equilibrium partial pressures $\approx 1.7 \times 10^{-3}$, $9.2 \times 10^{-7}$, and $3.9 \times 10^{-7}$ Torr, respectively, at a source temperature of 750 K. These values set the upper limits for the partial pressures of gas species. In experiments, the vacuum chamber is constantly evacuated and maintains a dynamic equilibrium. As a result, the total dynamic pressure from the combined gas phases at a source temperature of 750 K accounts for $\approx 10^{-6}$ Torr (Methods). Furthermore, to maintain the molecular flow state of gas species and sufficient overpressure of potassium near the surface of substrate, the chamber pressure was kept well below $10^{-3}$ Torr. From these analyses, it was determined that a practical growth window of $KTaO_3$ should be in $O_2$ partial pressures and substrate temperatures of $10^{-7}$-$10^{-5}$ Torr and 950-1000 K, respectively (dotted box, FIG. 2A).

FIG. 1A schematically depicts the experimental setup for the hybrid PLD growth. K was supplied by thermal evaporation of a $K_2O$ source from an effusion cell directed at the substrate. Ta was supplied by ablating a ceramic target of tantalum pentoxide ($Ta_2O_5$) using a pulsed excimer laser.

Approximately 8 nm-thick $KTaO_3$ thin films were synthesized on various single crystal substrates under various growth conditions (Methods). In the remainder, (pseudo-) cubic notations were used when referring to crystallographic orientations. The heteroepitaxial $KTaO_3$ thin films were first synthesized on $SrTiO_3$ (001) and (111) substrates, and their crystal structure and surface morphologies were investigated using X-ray diffraction and atomic force microscopy. The crystallinities of (001)- and (111)-oriented $KTaO_3$ thin films improved with increasing substrate temperature from 923 K to 1023 K. Focusing on surface morphologies, it was found that the substrate temperature was optimized at an intermediate temperature of 973 K for obtaining atomically-flat surfaces of $KTaO_3$ (111) films, while the $KTaO_3$ (001) films displayed essentially no changes with the substrate temperature.

Having confirmed high crystalline qualities in heteroepitaxial KTaO$_3$ (001) and (111) thin films, the stoichiometry in (pseudo-)homoepitaxial KTaO$_3$ (111) thin films was investigated. (Pseudo-)homoepitaxial KTaO$_3$ thin films were grown on bare and ≈1 nm-thick SmScO$_3$-buffered KtaO$_3$ (111) substrates. Homoepitaxial KTaO$_3$ films grown directly on bare KTaO$_3$ (111) substrates at a substrate temperature of 973 K showed atomically smooth surfaces. X-ray diffraction studies revealed that there was slight off-stoichiometry in the KTaO$_3$ thin film grown at 973 K and the increase in the substrate temperature up to 1023 K enhanced stoichiometry. On the other hand, the increased substrate temperature induced surface roughening because the low energy surfaces such as (001) and (011) were more stable than (111) at high temperatures. The strategy to overcome the trade-off between surface smoothness (optimized near 973 K) and stoichiometry (optimized near 1023 K) was to insert a thin SmScO$_3$ template grown layer by conventional PLD between the KTaO$_3$ (111) film and substrate. The SmScO$_3$ templates may serve three roles: (i) stabilizing the KTaO$_3$ surface by suppressing K evaporation from the surface of KTaO$_3$ substrate under high temperature and high vacuum; (ii) inhibiting the migration of native defects that may deteriorate the superconductivity from the KTaO$_3$ substrate to the film; and/or (iii) suppressing the leakage of charge carriers from the film to the substrate area where more disorder is expected.

To alleviate the lattice parameter and oxygen octahedral rotation mismatch between SmScO$_3$ (space group: Pbnm) and KTaO$_3$ (space group: Pm$\bar{3}$m), the thickness of the SmScO$_3$ template was restricted to be ≈1 nm. X-ray diffraction and atomic force microscopy validated this heterostructure design and demonstrated that the (pseudo-)homoepitaxial KTaO$_3$ thin film grown on SmScO$_3$-buffered KTaO$_3$ (111) substrate was stoichiometric and atomically smooth.

Figure 3B:
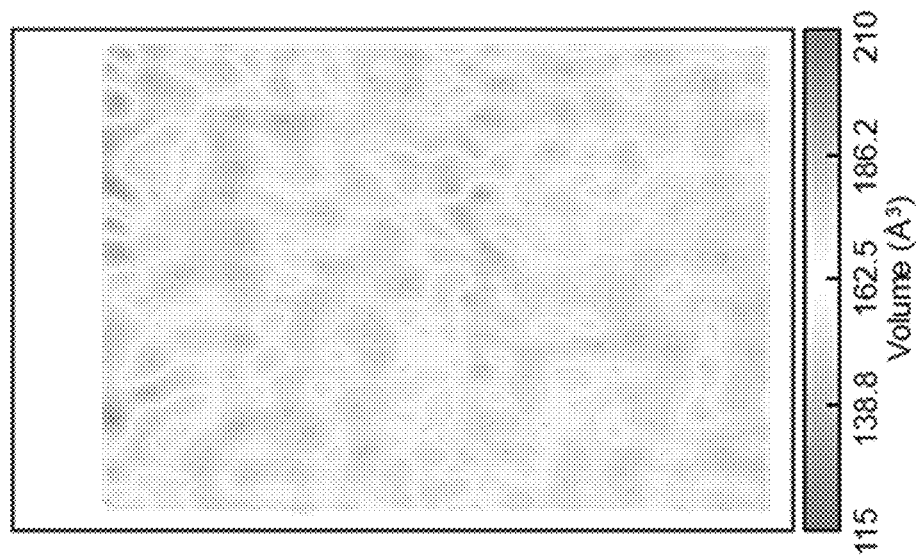
FIGS. 3A-3D show atomically sharp interfaces in an epitaxial $LaAlO_3$/$KTaO_3$/$SmScO_3$/$KTaO_3$ (111) heterostructure.
Figure 3A:
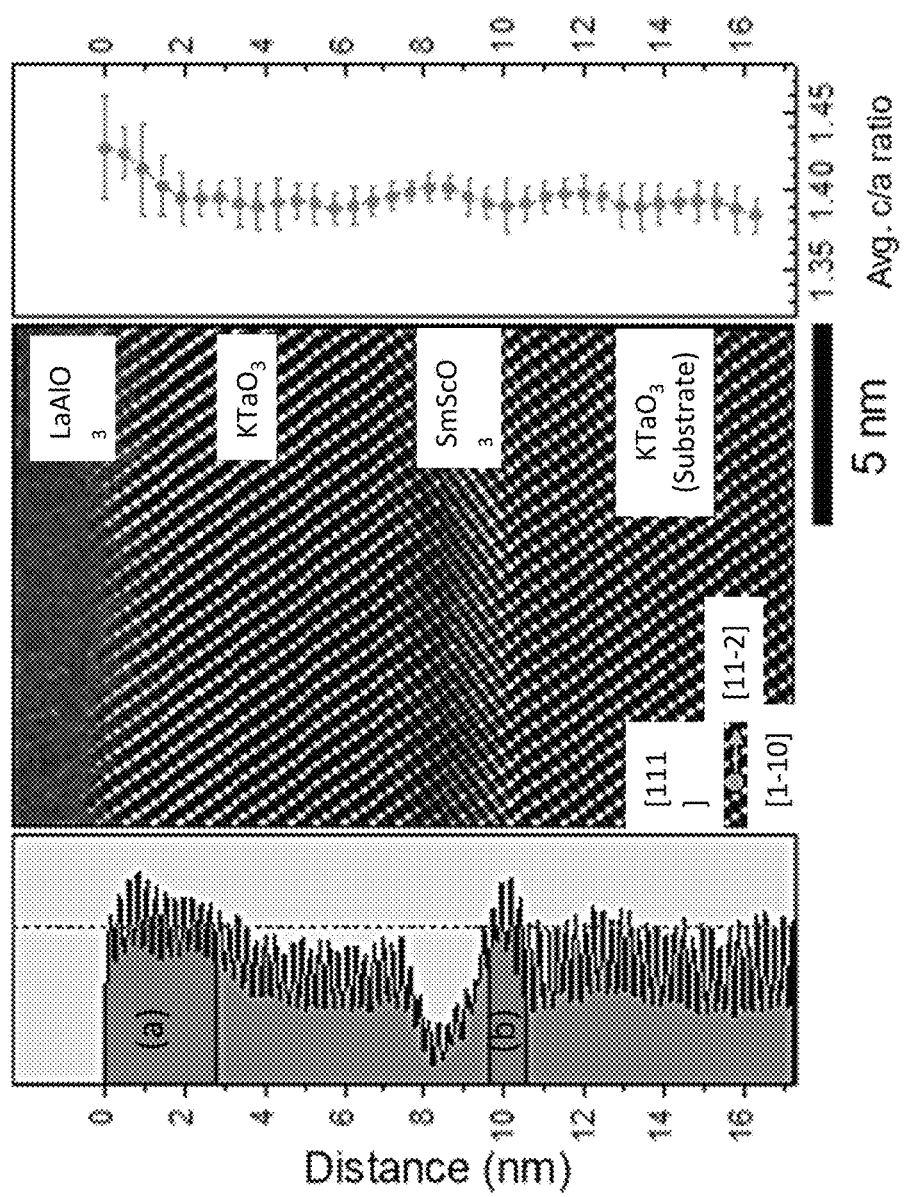
Figure 3D:
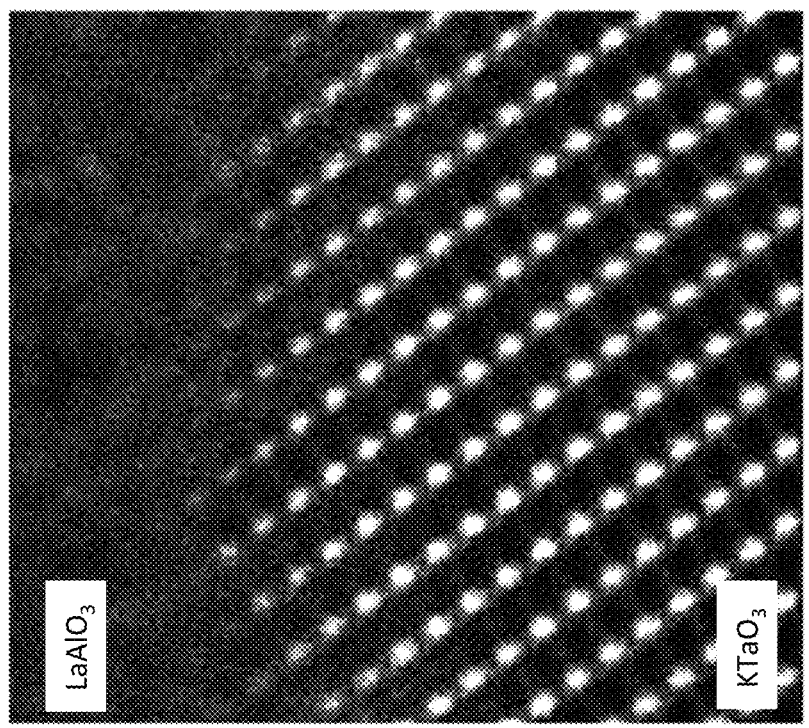
Figure 3C:
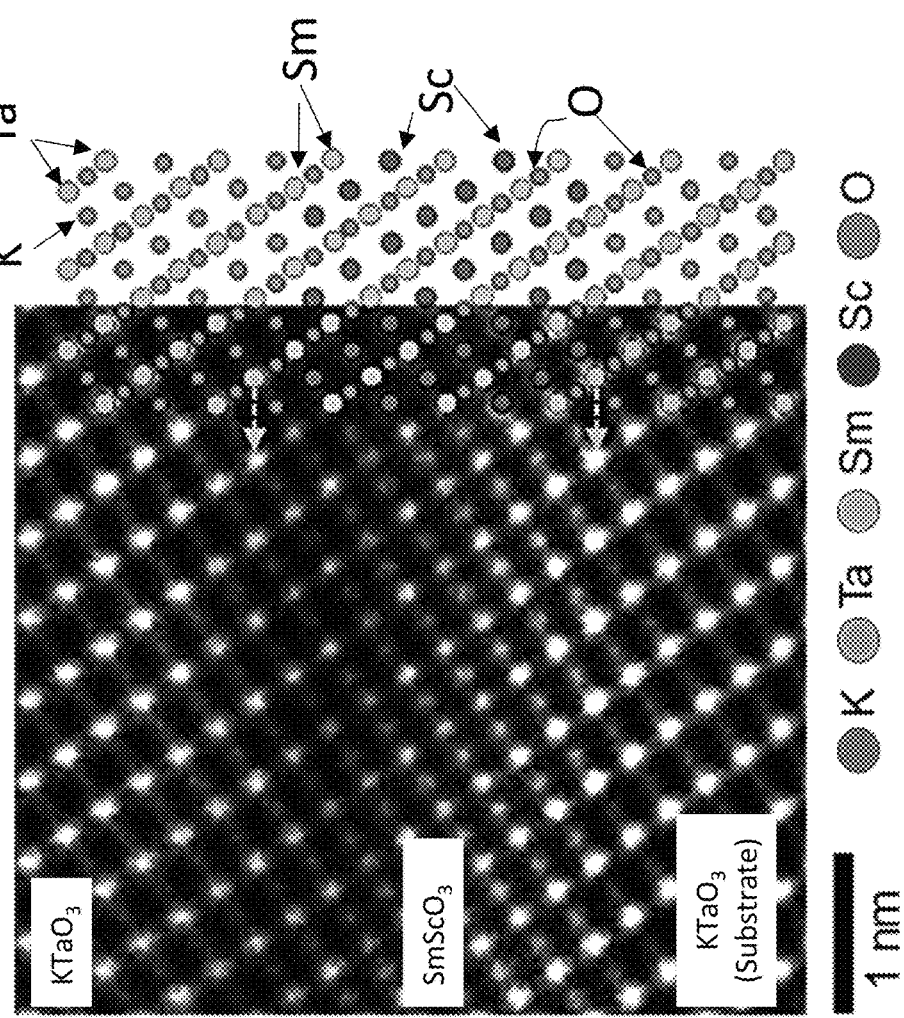

The interfacial structures of the LaAlO$_3$/KTaO$_3$/SmScO$_3$/KTaO$_3$ (111) heterostructures were characterized using atomic resolution scanning transmission electron microscopy (STEM, Methods). High-angle annular dark field (HAADF) cross-sectional images of the heterostructures (FIGS. 3A-3C) confirmed atomically-sharp interfaces of SmScO$_3$/KTaO$_3$ (111) substrate (FIG. 3B) and LaAlO$_3$/KTaO$_3$ (111) thin film (FIG. 3C), which means that thin SmScO$_3$ template could protect the unstable (111) surface of the KTO bulk substrate under the highly reducing atmosphere of ≈10$^{-6}$ Torr at 973 K. The KTaO$_3$ thin film was fully epitaxial to the KTaO$_3$ substrate through the underlying SmScO$_3$ template without any misfit dislocations because the lattice mismatch between SmScO$_3$ and KTaO$_3$ (111) is only ≈2.6%. Notably, the crystal structure of ≈1 nm-thick SmScO$_3$ film appeared to adopt a (pseudo-)cubic structure because the lattice spacings along the orthorhombic [001] and [110] were constant; and Sm and Sc atoms were aligned in a line, which cannot be shown in the orthorhombic phase of the bulk SmScO$_3$. Through the (pseudo-)cubic SmScO$_3$, the KTaO$_3$ (111) thin film was epitaxially grown with the desired cubic structure. An interesting feature in FIG. 3A is the contrast variation near the LaAlO$_3$/KTaO$_3$ (111) thin film and SmScO$_3$/KTaO$_3$ (111) substrate interfaces (FIG. 3D). The brighter contrast in the KTaO$_3$ (111) thin film near the top interface of LaAlO$_3$/KTaO$_3$ (111) thin film was attributed to the presence of doubly charged oxygen vacancies (V$_O$"), which are predicted to increase (decrease) the Ta—O (K—O) bond by ≈1.66%, corresponding to expansion along the out-of-plane direction and increase of c/a. Conversely, the brighter contrast in the KTaO$_3$ (111) substrate near the bottom SmScO$_3$/KTaO$_3$ (111) substrate interface was attributed to the presence of singly charged K vacancies (V$_K$'), which have a lower formation energy of ≈0.06 eV than V$_O$" (≈0.18 eV) and does not change the cell dimension. These observations directly confirm the higher crystalline qualities of the KTaO$_3$ (111) thin film compared to the KTaO$_3$ (111) substrate.

Figure 4F:
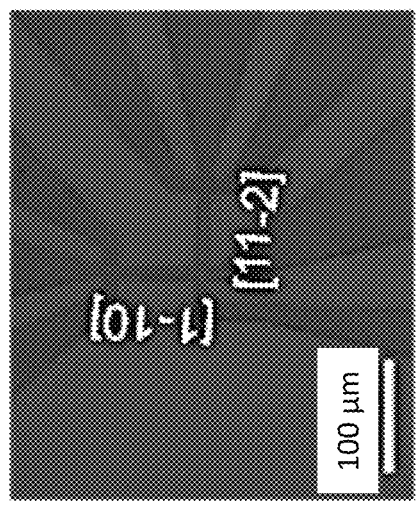
Figure 4I:
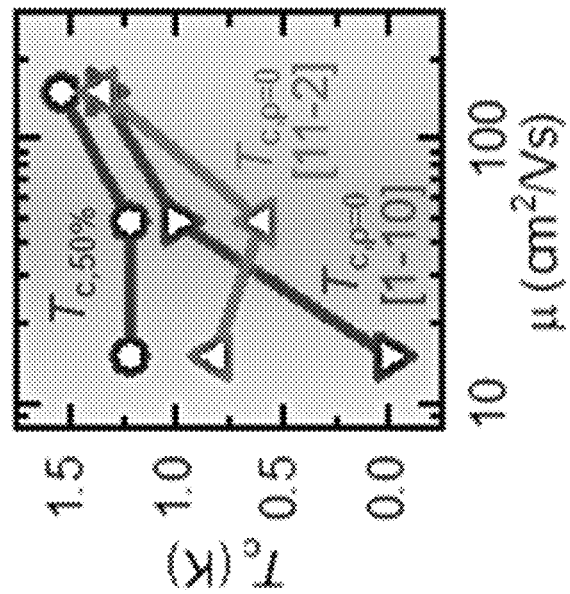
Figure 4E:
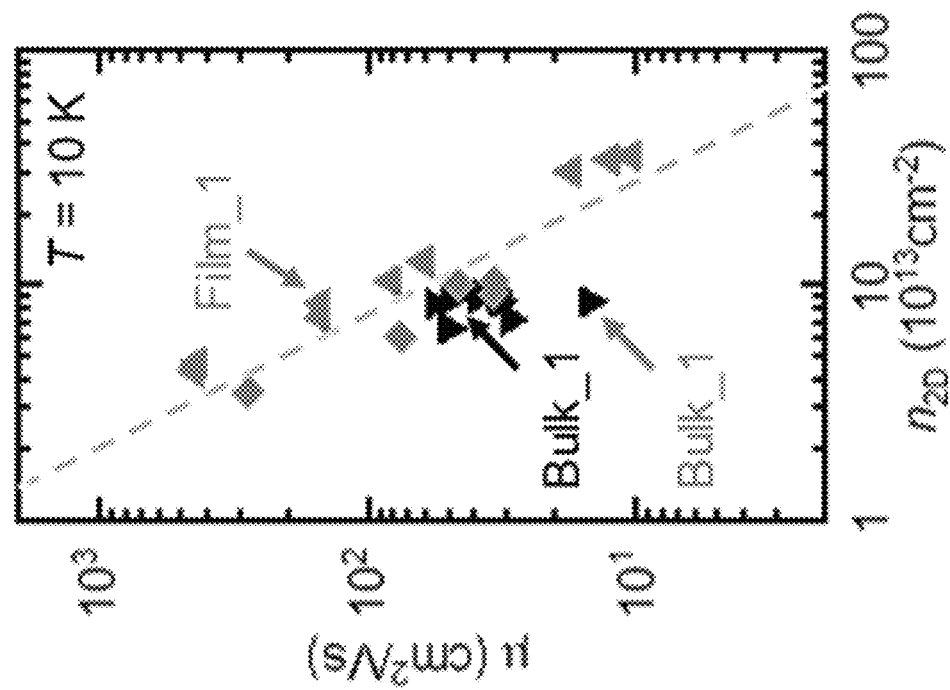

The transport measurements performed on the LaAlO$_3$/KTaO$_3$ (111) substrate (denoted as "Bulk_1" and "Bulk_2", Methods) and the LaAlO$_3$/KTaO$_3$/SmScO$_3$/KTaO$_3$ (111) substrate (denoted as "Film_1") heterostructures (FIGS. 4A-4K) were then studied. As shown in FIG. 4A, 2DEGs were created by depositing oxygen-deficient LaAlO$_3$ layers over the KaTaO$_3$ films. The LaAlO$_3$ layer was grown in situ in the case of the LaAlO$_3$/KTaO$_3$/SmScO$_3$/KTaO$_3$ (111) heterostructures, which produced clean interfaces. The transport data presented in the normal state (2 K<T<300 K) were obtained using a Van der Pauw geometry to probe the entire surface of the samples and ensure that the samples were macroscopically homogeneous (Methods). FIG. 4B shows the temperature dependence of R$_{sq}$ of the Bulk_1, Bulk_2 and Film_1 samples. Notably, the Film_1 sample showed the lowest R$_{sq}$ in the normal state (FIG. 4B) despite having nearly the same sheet carrier density (n$_{2D}$) (below 50 K) as the Bulk_1 and Bulk_2 samples (FIG. 4C). The lower R$_{sq}$ was attributed to the high mobility (µ) of the Film_1 sample (≈150 cm$^2$/Vs at 10 K) compared to the Bulk_1 and Bulk_2 samples (≈15 cm$^2$/Vs and 48 cm$^2$/Vs at 10 K, respectively). Multiple samples with the similar structures were tested as shown in FIG. 4A, and their distribution was plotted at 10 K in a µ-n$_{2D}$ diagram (FIG. 4E). The µ-n$_{2D}$ diagram clearly demonstrates that the LaAlO$_3$/KTaO$_3$/SmScO$_3$/KTaO$_3$ (111) substrate (up-triangles, FIG. 4E) heterostructures generally possessed higher µ within the same n$_{2D}$ range compared to the LaAlO$_3$/KTaO$_3$ (111) heterostructures (down-triangles, FIG. 4E). The differences in µ were attributed to the lower point defect concentrations, which dominated the impurity scattering at low temperatures, in the LaAlO$_3$/KTaO$_3$/SmScO$_3$/KTaO$_3$ (111) heterostructures. To further confirm the superior quality of the LaAlO$_3$/KTaO$_3$/SmScO$_3$/KTaO$_3$ (111) heterostructures, the n$_{2D}$ dependence of the mean free path (l) and k$_F$l was analyzed at 10 K, where k$_F$ is the Fermi wave vector, which confirmed that the LaAlO$_3$/KTaO$_3$/SmScO$_3$/KTaO$_3$ (111) heterostructures also possessed higher l and k$_F$l than the LaAlO$_3$/KTaO$_3$ (111) heterostructures and those reported in the literature regardless of n$_{2D}$. (Chen, Z. et al. Electric field control of superconductivity at the LaAlO$_3$/KTaO$_3$ (111) interface. *Science* 372, 721-724 (2021).) The analyses presented so far—X-ray diffraction, atomic force microscopy, STEM, and electrical transport measurements—cement the hybrid PLD as a new synthesis method to synthesize electronic-grade KTaO$_3$ thin films that are cleaner than their bulk single crystal counterparts.

Figures 4G, 4H, 4J, 4K:
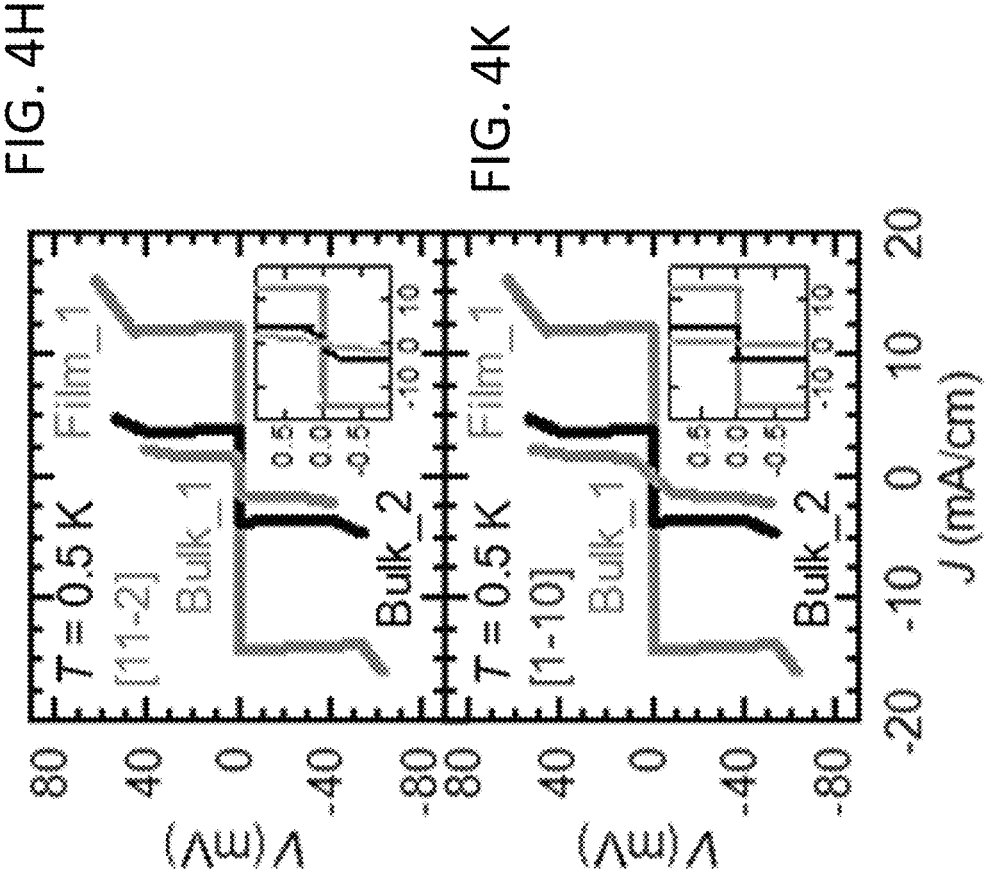
Figures 6A, 6B, 6C:
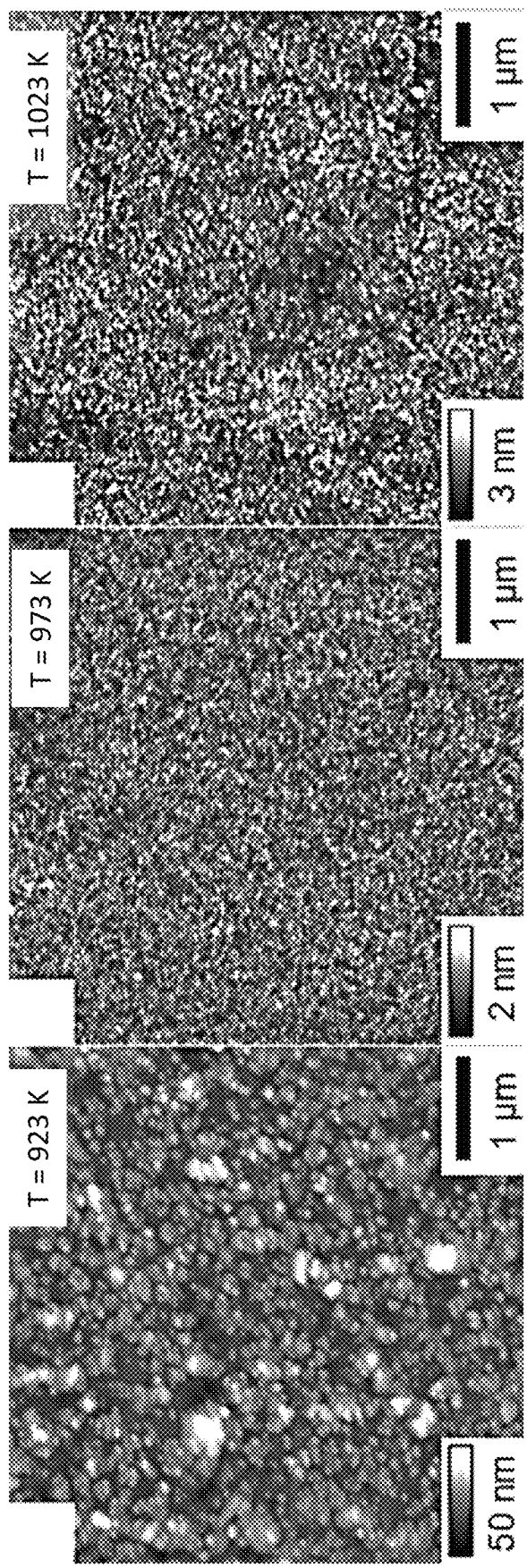
FIGS. 6A-6H show structural characterizations of $KTaO_3$/ $KTaO_3$ (111) homoepitaxial and $KTaO_3$/$SmScO_3$/$KTaO_3$ (111) (pseudo-)homoepitaxial structures.
Figures 6D, 6E, 6F:
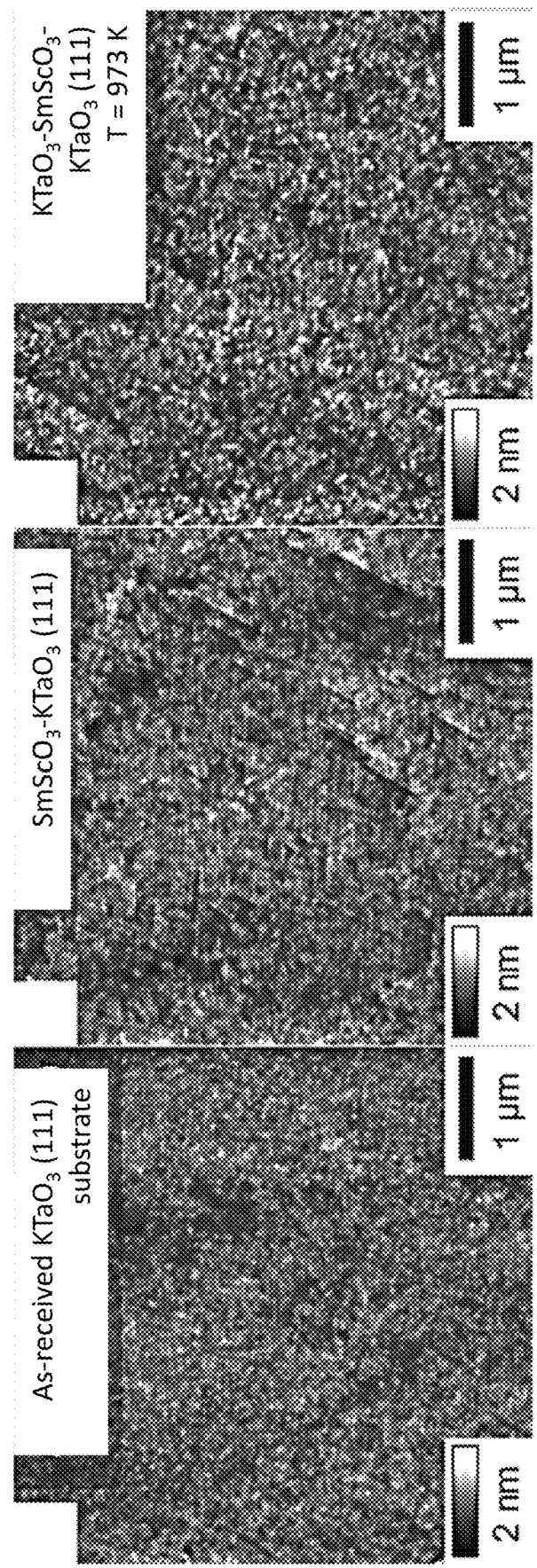
Figures 6G, 6H:
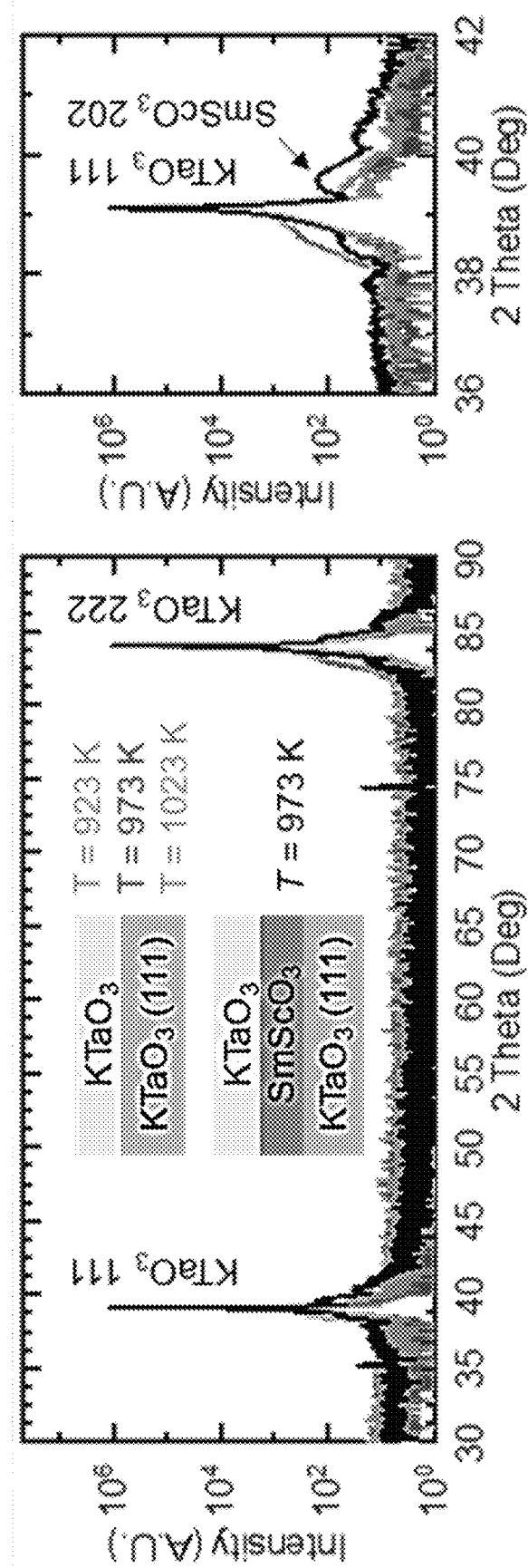

To investigate the superconductivity and anisotropic transport behavior exhibited by 2DEGs at the (111)-planes of KTaO$_3$, Hall bars were patterned along the [11-2] and [1-10] on the Bulk_1, Bulk_2, and Film_1 samples (FIG. 4F, Methods). FIGS. 4G and 4J show the R$_{sq}$ vs. T data at T<2 K along the [11-2] and [1-10], respectively. The Film_1 sample showed a T$_{c,\rho=0}$≈1.35 K along both directions (inset, FIGS. 4G, 4J), which was about 125% (35%) higher than the T$_{c,\rho=0}$≈0.60 K along the [11-2] ([1-10]) exhibited by the Bulk_2 sample. The Bulk_1 sample reached the zero-resistance state at ≈0.82 K along the [11-2] but failed to reach the zero-resistance along the [1-10] down to ≈0.2 K. The V-J curves at T=0.5 K of the three samples (FIGS. 4H, 4K) confirm the R$_{sq}$ vs. T data by the existence of J$_c$ excluding the Bulk_1 sample along the [1-10], which showed an Ohmic behavior (FIG. 4K). The Film_1 sample exhibited a substantially larger $J_c$ compared to the Bulk_1 and Bulk_2 samples ($\approx$1.6 mA/cm for Bulk_1, $\approx\approx$3.9 mA/cm for Bulk_2, $\approx$12.3 mA/cm for Film_1 samples, FIG. 4G). The $\mu$ evolution of $T_{c,\rho=0}$ and $T_{c,50\%}$ (FIG. 4I) and overlaying the Arrhenius plots of $R_{sq}$ vs. T and V-J curves along the [11-2] and [1-10] indicates that reduced disorder (i.e., higher,$\mu$) may eliminate signatures of disorder-induced inhomogeneities observed in the superconductivity of $KTaO_3$ (111).

Next, the effect of $n_{2D}$ on the superconductivity in our $KTaO_3$ (111) thin films at $n_{2D} \gg 10 \times 10^{13}$ cm$^{-2}$ was investigated. The $n_{2D}$ of $LaAlO_3/KTaO_3/SmScO_3/KTaO_3$ (111) heterostructures was controlled by growing $LaAlO_3$ overlayers in different atmospheres while keeping all other experimental conditions constant (Methods). In the following, samples with $n_{2D} \approx 4.7 \times 10^{13}$ cm$^{-2}$ (Film_2) and $n_{2D} \approx 30.5 \times 10^{13}$ cm$^{-2}$ (Film_3) at 10 K were focused on, which were compared with the Film_1 sample ($n_{2D} \approx 8.3 \times 10^{13}$ cm$^{-2}$ at 10 K, FIG. 4C). FIG. 5A shows the $R_{sq}$ vs. T curves (T<4 K) of the Film_1, Film_2 and Film_3 samples. The Film_2 (Film_3) sample showed lower (higher) normal state $R_{sq}$, $T_{c,\rho=0}$, $T_{c,50\%}$, and $T_{c,onset}$ than the Film_1 sample (FIGS. 5A, 5B). The V-J curves at T=0.5 K (Film_1, Film_3) and T=0.1 K (Film_2) are shown in FIG. 5C. In contrast to the $T_{c,\rho=0}$, $T_{c,50\%}$, and $T_{c,onset}$, the $J_c$ initially increased from $\approx$0.65 mA/cm (Film_2, 0.1 K) to $\approx$12.3 mA/cm (Film_1, 0.5 K) as $n_{2D}$ increased from $4.7 \times 10^{13}$ cm$^{-2}$ (Film_2) to $8.3 \times 10^{13}$ cm$^{-2}$ (Film_1) and then decreased to $\approx$8.3 mA/cm (Film_3, 0.5 K) at $n_{2D} \approx 30.5 \times 10^{13}$ cm$^{-2}$ (FIG. 5D).

As demonstrated here, hybrid PLD can be used to grow atomically-smooth, electronic-grade $KTaO_3$ (111) thin films, including atomically smooth, superconducting films.

Methods

Epitaxial $KTaO_3$ thin films of approximately 8 nm thickness were initially grown on single-terminated $SrTiO_3$ (001) and (111) substrates to experimentally determine the growth window. Growth on the (001) orientation was more easily achieved than growth on the (111) orientation. The substrate temperature has the most dominant effects on the growth window and surface morphology. For the hybrid PLD process, the background pressure was kept low to allow molecular flow of thermally evaporated species. In this example, the background pressure during the growth was kept at ~$10^{-5}$ Torr, and the laser fluence for PLD was kept just above the ablation threshold to minimize bombardment-induced defects.

Despite the polar nature of the $KTaO_3$ (001) surface, atomically-flat $KTaO_3$ films grown on $SrTiO_3$ (001) substrates were achieved over a wide range of growth parameters. Since the crystalline quality showed substantial improvements with increasing temperature, it is advantageous to use high substrate temperature to obtain electronic-grade thin films. The (111) surface was susceptible to temperature-induced surface roughening at or above 1023 K, although the crystallinity improved with increasing temperature.

Due to the volatility of potassium, exposure to high temperature and high vacuum conditions was expected to degrade the surface quality of the $KTaO_3$ substrate, compromising the homoepitaxial growth. To protect the $KTaO_3$ substrate surface, the growth of an approximately 8 nm-thick $SmScO_3$ thin film was grown on a $KTaO_3$ (111) substrate surface by conventional PLD and the high quality of the crystallinity and atomically-flat surface of the thin film was confirmed. To alleviate the lattice parameter and oxygen octahedral rotation mismatch between $SmScO_3$ (space group: Pbnm) and $KTaO_3$ (space group: Pm$\bar{3}$m), the thickness of the intervening $SmScO_3$ layer was restricted to be about 1 nm. The atomically flat nature of the surfaces of the $\approx$1 nm $SmScO_3$ and the $\approx$8 nm $KTaO_3$ and the lack of any extended defects (FIGS. 6A-6H).

Thermodynamic calculations of the K—Ta—O system. The thermodynamic database used in this example is based on the SGTE substance database (i.e., the SSUB5). (SGTE. *Thermodynamic Properties of Inorganic Materials*. (Springer-Verlag Berlin Heidelberg, 1999).) However, thermodynamic properties for the six ternary oxides ($KTa_5O_{13}$, $K_2Ta_4O_{11}$, $KTaO_3$, $K_3TaO_4$, $K_3Ta_8O_{21}$, and $K_2Ta_{15}O_{32}$) were absent in SSUB5. In this example, the thermodynamic properties were estimated with the reference states being the binary oxides (and pure element Ta) in SSUB5 according to the reactions in Table 1. The reaction enthalpies $\Delta H$ for these ternary oxides were based on density functional theory (DFT) based first-principles calculations in the literature, i.e., the Materials Project (MP) and the Open Quantum Materials Database (OQMD); see the predicted $\Delta H$ values in Table 1. (Jain, A. et al. *APL Mater.* 1, 011002 (2013); Kirklin, S. et al. *npj Comput. Mater.* 1, 15010 (2015).) Using the presently generated K—Ta—O database (SSUB5 together with the DFT-based $\Delta H$ values), thermodynamic calculations can be performed using the Thermo-Calc software. (Andersson, J.-O. et al., *CALPHAD* 26, 273-312 (2002).)

TABLE 1

Reaction enthalpies $\Delta H$ for six ternary oxides based on the DFT-based databases of Materials Project (MP)[2] and the Open Quantum Materials Database (OQMD)[3]. (See, Jain, A. et al. Commentary: The Materials Project: A materials genome approach to accelerating materials innovation. *APL Mater.* 1, 011002 (2013); and Kirklin, S. et al. The Open Quantum Materials Database (OQMD): assessing the accuracy of DFT formation energies. npj *Comput. Mater.* 1, 15010 (2015).)

| No. | Reactions | $\Delta H$ (Joule per unit formula, J/U.F.) |
|---|---|---|
| 1 | $K_2O + 5\ Ta_2O_5 = 2\ KTa_5O_{13}$ | −219107 (for 19 atoms, by MP) |
| 2 | $K_2O + 2\ Ta_2O_5 = K_2Ta_4O_{11}$ | −383912 (for 17 atoms, by MP) |
| 3 | $K_2O + Ta_2O_5 = 2\ KTaO_3$ | −175891 (for 5 atoms, by MP)[a] −179172 (for 5 atoms, by OQMD) |
| 4 | $3\ K_2O + Ta_2O_5 = 2\ K_3TaO_4$ | −336056 (for 8 atoms, by OQMD) |
| 5 | $15\ K_2O + 39\ Ta_2O_5 + 2\ Ta = 10\ K_3Ta_8O_{21}$ | −613499 (for 32 atoms, by MP) |
| 6 | $5\ K_2O + 31\ Ta_2O_5 + 13\ Ta \rightarrow 5\ K_2Ta_{15}O_{32}$ | −465582 (for 49 atoms, by MP) |

[a]This value used in the present example.

Film synthesis and structural characterizations. Film synthesis and structural characterizations. Hybrid PLD using a KrF excimer laser (248 nm, LPX 300, Coherent) and a home-built effusion cell were used to grow epitaxial $KTaO_3$ thin films on single crystal $KTaO_3$ (111), $SrTiO_3$ (111), $SrTiO_3$ (001) substrates. To obtain the $TiO_2$-terminated substrates, as-received $SrTiO_3$ substrates were etched using buffered hydrofluoric acid (Sigma Aldrich) for 1 min and annealed at 1273 K for 6 hr. The $KTaO_3$ growth was carried out at a heater temperature of 973 K in a chamber pressure of $10^{-6}$ Torr. To supply tantalum, a ceramic target of $Ta_2O_5$ (purity 99.9%, Praxair) was ablated using a laser fluence of 0.5 J/cm² and a laser repetition rate of 20 Hz with a target-to-substrate distance of 65 mm. To supply potassium, 5 g of $K_2O$ powders (purity 99.9%, Nanoshel) were used as source and loaded in a magnesium oxide crucible of cylindrical shape with a diameter of 16 mm and a length of 100 mm. To protect the effusion cell from reaction with potassium vapors, the effusion cell was shielded with tantalum foils. The crucible was heated using a home-built effusion cell and $K_2O$ source was pre-evaporated at an effusion cell temperature of 873 K in vacuum for de-gassing. Following pre-evaporation, the effusion cell temperature was lowered to 750 K and maintained during the $KTaO_3$ growth. Following the $KTaO_3$ growth, the samples were cooled down to 823 K by quenching in a static oxygen pressure of 500 Torr and annealed in situ for 30 min. The growth rate for $KTaO_3$ was approximately 0.0044 Å per laser pulse (≈2.5 u.c./min). The laser fluence was kept at slightly above the ablation threshold for $Ta_2O_5$ ceramic to minimize the high kinetic energy ion bombardment during the $KTaO_3$ growth. The $SmScO_3$ growth was carried out by conventional PLD at a heater temperature of 973 K in a dynamic oxygen pressure of 20 mTorr with a laser fluence of 0.6 J/cm² and a laser repetition rate of 1 Hz from a ceramic target (Praxair) of the same composition with a target-to-substrate distance of 65 mm. The growth rate of $SmScO_3$ was approximately 0.066 Å per laser pulse. Following the growth, the samples were cooled to room temperature by quenching in a static oxygen pressure of 500 Torr. The $LaAlO_3$ growth was carried out in situ by conventional PLD at a heater temperature of 673 K in a dynamic oxygen pressure of $10^{-5}$ Torr with a laser fluence of 1.05 J/cm² and a laser repetition rate of 1 Hz from a single crystal $LaAlO_3$ target (Crystec) with a target-to-substrate distance of 65 mm. The growth rate of $LaAlO_3$ was approximately 0.11 Å per laser pulse. Following the growth, the samples were cooled to room temperature by quenching in the growth atmosphere. X-ray diffraction measurements were conducted with a high-resolution X-ray diffractometer (Bruker). Surface topography images were collected with an atomic force microscope operated in a tapping mode (Veeco).

Transport measurements. Device fabrication. Hall bars were fabricated with standard photolithography. First, Au markers were deposited for alignment purpose. AZ4210 photoresist was patterned to cover and protect the Hall bar-shaped regions. The exposed regions underwent inductively coupled plasma reactive ion etching (ICPRIE) for 18 minutes in a Plasma-Therm APEX ICPRIE. During the etching, 5 sccm of $BCl_3$, 50 sccm of $Cl_2$, and 5 sccm of Ar were used as gas etchant, with RIE power set to 100 W. After the etching, the photoresist was removed in MICROPOSIT Remover 1165, then acetone and IPA. The etching depth was measured to be ≈50 nm by atomic force microscope.

Electrical transport. The electrical transport measurements were carried out using a four-contact van der Pauw geometry over a temperature range of 2 to 300 K. Two van der Pauw sheet resistance and two Hall measurement configurations were switched between while sweeping a magnetic field over a range of −1 to 1 T. Individual configuration resistances were computed by sourcing a d.c. current of alternating polarity and combining the voltages to compute a resistance free of voltage noise from effects including the Seebeck effect. The two resistances from the sheet-resistance configurations ($R_1$, $R_2$) were combined using the van der Pauw equation, $1=\exp(-\pi R_1/R_{sq})+\exp(-\pi R_2/R_{sq})$, to determine the sheet resistance, $R_{sq}$. The two Hall resistances were averaged to compute the Hall resistance, RH. The carrier density, $n_{2D}$, was computed with the equation $n_{2D}=1/[(dR_H/dB)q]$, where I is the magnitude of the d.c. current sourced, and q the electron charge. The mobility, was computed with the equation $\mu=1/(R_{sq}\, n_{2D}\, q)$.

Magnetotransport and Superconductivity. Superconductivity measurements on Hall bars below 2 K were carried out in a Quantum Design PPMS refrigerator with a dilution unit. Source voltages were applied by a 24-bit digital/analog converter National Instruments PXI-4461, which can also simultaneously perform 24-bit analog/digital conversion. Current biasing was achieved by shunting the Hall bar device with a 300 kΩ in-series resistor. The drain current and voltages were measured after amplification by a Krohn-Hite Model 7008 Multi-channel Pre-amplifier. For each current-voltage characteristic, the current sweep started from 0 bias, then went to maximum bias, to minimum bias, and finally finished at 0 bias. The whole sweep took ≈20 s. For 0 bias resistance measurement, a small AC current was sourced $I=I_0 \cos(2\pi ft)$ where f=13 Hz and $I_0$<100 nA. The voltage $V_0$ across the Hallbar channel was measured by a homemade digital lock-in amplifier to get four-terminal resistance $R=V_0/I_0$.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" can mean only one or can mean "one or more." Embodiments of the inventions consistent with either construction are covered.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

If not already included, all numeric values of parameters in the present disclosure are proceeded by the term "about" which means approximately. This encompasses those variations inherent to the measurement of the relevant parameter as understood by those of ordinary skill in the art. This also encompasses the exact value of the disclosed numeric value and values that round to the disclosed numeric value.

What is claimed is:

1. A method of forming a film of a layered complex oxide, the method comprising:
   providing a deposition substrate and a solid metal oxide target comprising oxygen and a first metal in a vacuum chamber;
   forming a molecular beam directed at the deposition substrate, wherein the molecular beam is formed by evaporation of an oxide of a second metal, the second metal having a higher vapor pressure than the first metal; and
   laser ablating the solid metal oxide target using a pulsed laser to generate a plume of ablated target material in the presence of the molecular beam, wherein the film of the layered complex oxide is grown epitaxially on the deposition substrate via layer-by-layer deposition from the plume of ablated target material and the molecular beam.

2. The method of claim 1, wherein the oxide of the second metal is a suboxide of the second metal.

3. The method of claim 2, wherein the vapor pressure of the second metal is at least ten times higher than the vapor pressure of the first metal at a deposition temperature of the film of the layered complex oxide.

4. The method of claim 2, wherein the first metal is a transition metal and the second metal is an alkali metal.

5. The method of claim 4, wherein the transition metal is a refractory metal.

6. The method of claim 5, wherein the alkali metal is potassium or lithium and the refractory metal is niobium, molybdenum, tantalum, and tungsten.

7. The method of claim 2, wherein the solid metal oxide target comprises a refractory metal oxide, the molecular beam comprises an alkali metal, and the layered complex oxide has the formula $A^{1+}B^{5+}O_3$, where A represents an alkali metal atom and B represents a refractory metal atom.

8. The method of claim 7, wherein the refractory metal oxide is $Ta_2O_5$, the alkali metal is K, and the layered complex metal oxide is $KTaO_3$.

9. The method of claim 8, wherein the deposition substrate comprises $KTaO_3$ (111).

10. The method of claim 9, wherein the deposition substrate comprises a $SmScO_3$ growth template layer between the $KTaO_3$ (111) substrate and the $KTaO_3$ film.

11. The method of claim 8, wherein the deposition substrate comprises $SrTiO_3$ (111) or $SrTiO_3$ (001).

12. The method of claim 2, wherein the solid metal oxide target comprises a niobium oxide, the molecular beam comprises an alkali metal, and the layered complex oxide is an alkali metal niobate.

13. The method of claim 12, wherein the layered complex oxide is $LiNbO_3$ or potassium $KNbO_3$.

14. The method of claim 2, wherein the solid metal oxide target comprises a bismuth oxide, the molecular beam comprises an alkali metal, and the layered complex oxide is an alkali metal bismuthate.

15. The method of claim 2, wherein the solid metal oxide target comprises a vanadium oxide, the molecular beam comprises an alkali metal, and the layered complex oxide is an alkali metal vanadate.

16. The method of claim 1, wherein the molecular beam is formed by thermal evaporation of the oxide of the second metal in an effusion cell.

* * * * *